(12) United States Patent
Wang et al.

(10) Patent No.: US 10,995,102 B2
(45) Date of Patent: May 4, 2021

(54) CRYSTALS FOR DETECTING NEUTRONS, GAMMA RAYS, AND X RAYS AND PREPARATION METHODS THEREOF

(71) Applicant: MEISHAN BOYA ADVANCED MATERIALS CO., LTD., Sichuan (CN)

(72) Inventors: Yu Wang, Meishan (CN); Weiming Guan, Meishan (CN); Min Li, Meishan (CN)

(73) Assignee: MEISHAN BOYA ADVANCED MATERIALS CO., LTD., Meishan (CN)

(*) Notice: Subject to any disclaimer, the term of this patent is extended or adjusted under 35 U.S.C. 154(b) by 0 days.

(21) Appl. No.: 16/903,322

(22) Filed: Jun. 16, 2020

(65) Prior Publication Data
US 2021/0053993 A1    Feb. 25, 2021

Related U.S. Application Data

(63) Continuation of application No. PCT/CN2019/101680, filed on Aug. 21, 2019.

(51) Int. Cl.
*C07F 5/00* (2006.01)
*C30B 15/00* (2006.01)
(Continued)

(52) U.S. Cl.
CPC .............. *C07F 5/003* (2013.01); *C30B 15/00* (2013.01); *C30B 15/002* (2013.01); *C30B 29/22* (2013.01); *G01T 1/2023* (2013.01); *G01T 3/06* (2013.01)

(58) Field of Classification Search
CPC ......... C30B 29/34; C30B 15/00; C30B 29/22; C30B 15/002; C07F 5/003; G01T 1/2023; G01T 3/06
See application file for complete search history.

(56) References Cited

U.S. PATENT DOCUMENTS 5,164,041 A * 11/1992 Berkstresser ............ C30B 15/00
                                                         117/19
5,660,627 A *  8/1997 Manente ................... C30B 15/00
                                                         117/12
(Continued)

FOREIGN PATENT DOCUMENTS

CN     106757349 A    5/2017
CN     106757354 A    5/2017
(Continued)

OTHER PUBLICATIONS

European Patent Office, English computer translation of JP 2008169095A (Year: 2020).*
(Continued)

*Primary Examiner* — Matthew J Song
(74) *Attorney, Agent, or Firm* — Metis IP LLC

(57) ABSTRACT

The present disclosure discloses a method for growing a crystal for detecting neutrons, gamma rays, and/or x rays. The method may include weighting reactants based on a molar ratio of the reactants according to a reaction equation $(1-x-z)X_2O_3+SiO_2+2xCeO_2+zZ_2O_3 \rightarrow X_{2(1-x-z)}Ce_{2x}Z_{2z}SiO_5+x/2O_2\uparrow$ or $(1-x-y-z)X_2O_3+yY_2O_3+SiO_2+2xCeO_2+zZ_2O_3 \rightarrow X_{2(1-x-y-z)}Y_{2y}Ce_{2x}Z_{2z}SiO_5+x/2O_2\uparrow$; placing the reactants on which a second preprocessing operation has been performed into a crystal growth device after an assembly processing operation is performed on at least one component of the crystal growth device; introducing a flowing gas into the crystal growth device after sealing the crystal growth device; and activating the crystal growth device to grow the crystal based on the Czochralski technique.

5 Claims, 9 Drawing Sheets

(51) Int. Cl.
*G01T 3/06* (2006.01)
*G01T 1/202* (2006.01)
*C30B 29/22* (2006.01)

(56) References Cited

U.S. PATENT DOCUMENTS

| | | | | |
|---|---|---|---|---|
| 5,690,731 | A * | 11/1997 | Kurata | C30B 15/30 117/13 |
| 6,323,489 | B1 * | 11/2001 | McClellan | G01T 1/2023 250/361 R |
| 6,348,095 | B1 * | 2/2002 | Watanabe | C30B 15/14 117/13 |
| 2001/0056234 | A1 * | 12/2001 | Weinberg | A61B 6/4258 600/436 |
| 2005/0056204 | A1 * | 3/2005 | Kurashige | C30B 29/34 117/2 |
| 2007/0262288 | A1 | 11/2007 | Naum | |
| 2008/0299027 | A1 * | 12/2008 | Kurata | C30B 33/02 423/263 |
| 2012/0145964 | A1 * | 6/2012 | Andreaco | C30B 15/04 252/301.6 R |
| 2013/0175475 | A1 | 7/2013 | Ouspenski | |
| 2013/0291788 | A1 * | 11/2013 | Houzvicka | C30B 15/00 117/15 |
| 2015/0136992 | A1 * | 5/2015 | Cohen | C09K 11/7774 250/362 |
| 2017/0327966 | A1 * | 11/2017 | Narushima | C30B 15/04 |
| 2019/0204458 | A1 | 7/2019 | Blahuta et al. | |

FOREIGN PATENT DOCUMENTS

| | | | | |
|---|---|---|---|---|
| CN | 109338461 A | | 2/2019 | |
| JP | 63230589 A | * | 9/1988 | C30B 15/00 |
| JP | 2008169095 A | * | 7/2008 | C30B 29/22 |
| WO | 2012066425 A2 | | 5/2012 | |

OTHER PUBLICATIONS

European Patent Office, English computer translation of JP 63230589 A (Year: 2020).*

* cited by examiner

300

214-1

214-1

214-2

214-2

CRYSTALS FOR DETECTING NEUTRONS, GAMMA RAYS, AND X RAYS AND PREPARATION METHODS THEREOF

CROSS-REFERENCE TO RELATED APPLICATIONS

This application is a continuation of International Patent Application No. PCT/CN2019/101680 field on Aug. 21, 2019, the entire contents of which are hereby incorporated by reference.

TECHNICAL FIELD

The present disclosure relates to the field of crystal growth, in particular, to a crystal with neutron activity and γ/X-ray activity and methods for growing the crystal.

BACKGROUND

Currently, the scintillation crystal can be used to detect γ-rays and X-rays, but cannot be used to detect neutrons. The neutron detection is widely used in nuclear energy field (e.g., nuclear reactor monitoring field, nuclear power plant monitoring field), an arms control field (e.g., nuclear explosion field, weapon fire control and guidance), an anti-terrorism security monitoring field (e.g., detection of hidden nuclear material), space physics field, aerospace field, oil well exploration field, or the like, or any combination thereof. Therefore, it is desirable to provide a scintillation crystal with neutron activity and γ/X-ray activity. For a scintillation crystal with doped elements (e.g., lithium, gallium), secondary charged particles generated by a nuclear reaction between the doped elements and neutrons may be used to achieve indirect neutron detection.

SUMMARY

The present disclosure discloses a method for crystal growth. The method for crystal growth has excellent repeatability and crystal performance consistency. According to the method, problems are solved, for example, the volatility of $SiO_2$, cracking and component deviation of the crystal during the crystal growth process, long growth cycle, difficulty of obtaining crystals with uniform scintillation performance and without oxygen-free vacancy.

According to an aspect of the present disclosure, a method for growing a crystal is provided. The method may include weighting reactants based on a molar ratio of the reactants according to a reaction equation (1) or a reaction equation (2) after a first preprocessing operation is performed on the reactants: $(1-x-z)X_2O_3+SiO_2+2xCeO_2+zZ_2O_3 \rightarrow X_{2(1-x-z)}Ce_{2x}Z_{2z}SiO_5+x/2O_2\uparrow$ (1) or $(1-x-y-z)X_2O_3+yY_2O_3+SiO_2+2xCeO_2+zZ_2O_3 \rightarrow X_{2(1-x-y-z)}Y_{2y}Ce_{2x}Z_{2z}SiO_5+x/2O_2\uparrow$ (2), wherein x=0.0001%~6%, y=0%~100%, Z may consist of at least one of Li, B, Gd, Mg, Ca, or Tb, X may consist of at least one of Lu, La, Y, Gd, Pr, Ce, Nd, Pm, Sm, Eu, Tb, Dy, Ho, Er, Tm, Yb, Mn, Mg, Ca, Al, Fe, Sr, or Ba, and z=0.0001~6%, a weight of $SiO_2$ excessing of 0.01%~10% of its weight. The method may include placing the reactants on which a second preprocessing operation has been performed into a crystal growth device after an assembly processing operation is performed on at least one component of the crystal growth device. The method may include introducing a flowing gas into the crystal growth device after sealing the crystal growth device. The method may further include activating the crystal growth device to grow the crystal based on the Czochralski technique.

In some embodiments, a purity of each of the reactants may be greater than 99.99% or 99.999%.

In some embodiments, a value of x may be 0.1%~0.6%.

In some embodiments, a value of y may be 5%~30%.

In some embodiments, a value of z may be 0.1~0.6%.

In some embodiments, the weight of $SiO_2$ may excess 0.05%~3% of its weight.

In some embodiments, the at least one component of the crystal growth device may include a crucible, and the assembly processing operation may include at least one of performing an acid soaking and cleaning operation on the crucible, determining whether a vertical distance between an upper edge of the crucible and an upper edge of an induction coil mounted in the crystal growth device is 0 mm~∓50 mm, wherein "+" represents that the upper edge of the crucible is higher than the upper edge of the induction coil, and "−" represents that the upper edge of the crucible is lower than the upper edge of the induction coil, or cleaning an impurity in the crucible.

In some embodiments, the second preprocessing operation may include at least one of an ingredient mixing operation or a pressing operation.

In some embodiments, the flowing gas may include one or more of oxygen, nitrogen, or inert gas. When the flowing gas includes the oxygen during the crystal growth, a volume ratio of the oxygen may be 0.001%~10%.

In some embodiments, a flow rate of the flowing gas may be 0.01 L/min~50 L/min.

In some embodiments, a purity of the following gas may be greater than 99%, 99.9%, 99.99%, or 99.999%.

In some embodiments, a melting time of a heat treatment for melting the reactants may be 10 hours~30 hours during the crystal growth.

In some embodiments, the method may further include adding a seed crystal, the seed crystal including at least one of Cerium-doped Lutetium(-yttrium) oxyorthosilicate, Lanthanum-doped Lutetium(-yttrium) oxyorthosilicate, Praseodymium-doped Lutetium(-yttrium) oxyorthosilicate, or Neodymium-doped Lutetium(-yttrium) oxyorthosilicate.

In some embodiments, a distance between the seed crystal and an upper surface of the reactants may be 5 mm~100 mm or a predetermined distance during melting the reactants during the crystal growth.

In some embodiments, the method may include sinking the seed crystal to 0.1 mm~50 mm below a surface of a melt of the reactants by controlling a pulling rod during temperature adjustment, and pulling up the pulling rod after maintaining a constant temperature for at least 0.1 hours~1 hour.

In some embodiments, a rotation rate of the pulling rod may be 0.01 r/min~35 r/min during the crystal growth.

In some embodiments, a growth rate of the crystal may be 0.01 mm/h~6 mm/h during the crystal growth.

In some embodiments, a temperature decreasing time of the crystal during the crystal growth may be 20 hours~100 hours.

In some embodiments, during a shouldering process of the crystal growth, a shoulder angle may be 30 degrees~70 degrees, and a shoulder length may be 40 mm~90 mm.

In some embodiments, a constant diameter during the shouldering process may be 10 mm~200 mm.

In some embodiments, during an ending process of the crystal growth, an ending angle may be 30 degrees~70 degrees, and an ending length may be 40 mm~90 mm.

In some embodiments, the crystal growth may be controlled by a proportional-integral-derivative (PID) controller, and a PID parameter may be 0.1~5.

In some embodiments, a reactant consisting of Ce in the reaction equation (1) or the reaction equation (2) may include $CeO_2$, $Ce_2O_3$, $Ce(CO_3)_2$, $CeCl_3$, $CeF_3$, $CeS$, $CeBr_3$, $CeRu_2$, $CeCo_2$, $CeRh_3$, $CeN$, $CePd_3$, $CeI_3$, $CeF_4$, or $CeCl_4$.

In some embodiments, $SiO_5^{2-}$ may include $Cl^-$, $F^-$, $Br^-$, or S.

In some embodiments, the first preprocessing operation may include a roasting operation under 800° C.~1400° C.

According to another aspect of the present disclosure, a device for growing a crystal is provided. The device may include a temperature field device. The temperature field device may include a bottom plate, at least one cover plate, at least one drum, a filler, and a crucible. The at least one cover plate may include a first cover plate. The at least one drum may include a first drum and a second drum. The bottom plate may be mounted at a bottom of the temperature field device and cover an open end of the first drum. The first cover plate may be mounted at a top of the temperature field device and cover the other open end of the first drum. The second drum may be mounted within the first drum. The filler may be filled in the second drum, and/or a space between the first drum and the second drum. The filler filled in the second drum may be at least configured to support the crucible and cover at least a portion of the crucible. Reactants used for growing the crystal may be placed in the crucible to react.

In some embodiments, the at least one cover plate may include a second cover plate. The second cover plate may be mounted inside the first drum, which may be configured to cover an open end of the second drum near the first cover plate.

In some embodiments, the first drum may include a quartz drum, a corundum drum, or a drum made of heat resistant material.

In some embodiments, the second drum may include a zirconium drum.

In some embodiments, the device may further include a heater. The heater may be mounted above the crucible.

In some embodiments, the heater may be made of one or more of iridium, platinum, molybdenum, tungsten, graphite, or a material which has a high melting point and can be heated by electromagnetic induction. An inner diameter of the heater may be 60 mm~240 mm, an outer diameter of the heater may be 64 mm~260 mm, and a height of the heater may be 2 mm~200 mm.

According to yet another aspect of the present disclosure, a crystal is provided. A formula of the crystal may be

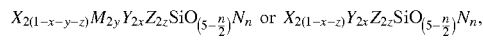

wherein x=0.0001%~6%, y=0%~100%, z=0.0001~6%, a value of n may be 0~5, X may consist of at least one of an element or one or more compounds containing Ce, the element including Lu, La, Y, Gd, Pr, Ce, Nd, Pm, Sm, Eu, Tb, Dy, Ho, Er, Tm, Yb, Mn, Mg, Ca, Al, Fe, Sr, or Ba, and the one or more compounds containing Ce including $CeO_2$, $Ce_2O_3$, $Ce(CO_3)_2$, $CeCl_3$, $CeF_3$, $CeS$, $CeBr_3$, $CeRu_2$, $CeCo_2$, $CeRh_3$, $CeN$, $CePd_3$, $CeI_3$, $CeF_4$, or $CeCl_4$, Y may consist of at least one of Ce, Cl, F, Br, N, P, or S, M may consist of at least one of Sc, Y, Gd, or Lu, N may consist of at least one of Cl, F, Br, or S, and $SiO_5^{2-}$ may include Cl—, F—, $Br^-$, or $S^-$.

In some embodiments, a value of x may be 0.1%~0.6%.
In some embodiments, a value of y may be 5%~30%.
In some embodiments, a value of z may be 0.1~0.6%.
In some embodiments, the crystal may be at least used for neutron detection.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
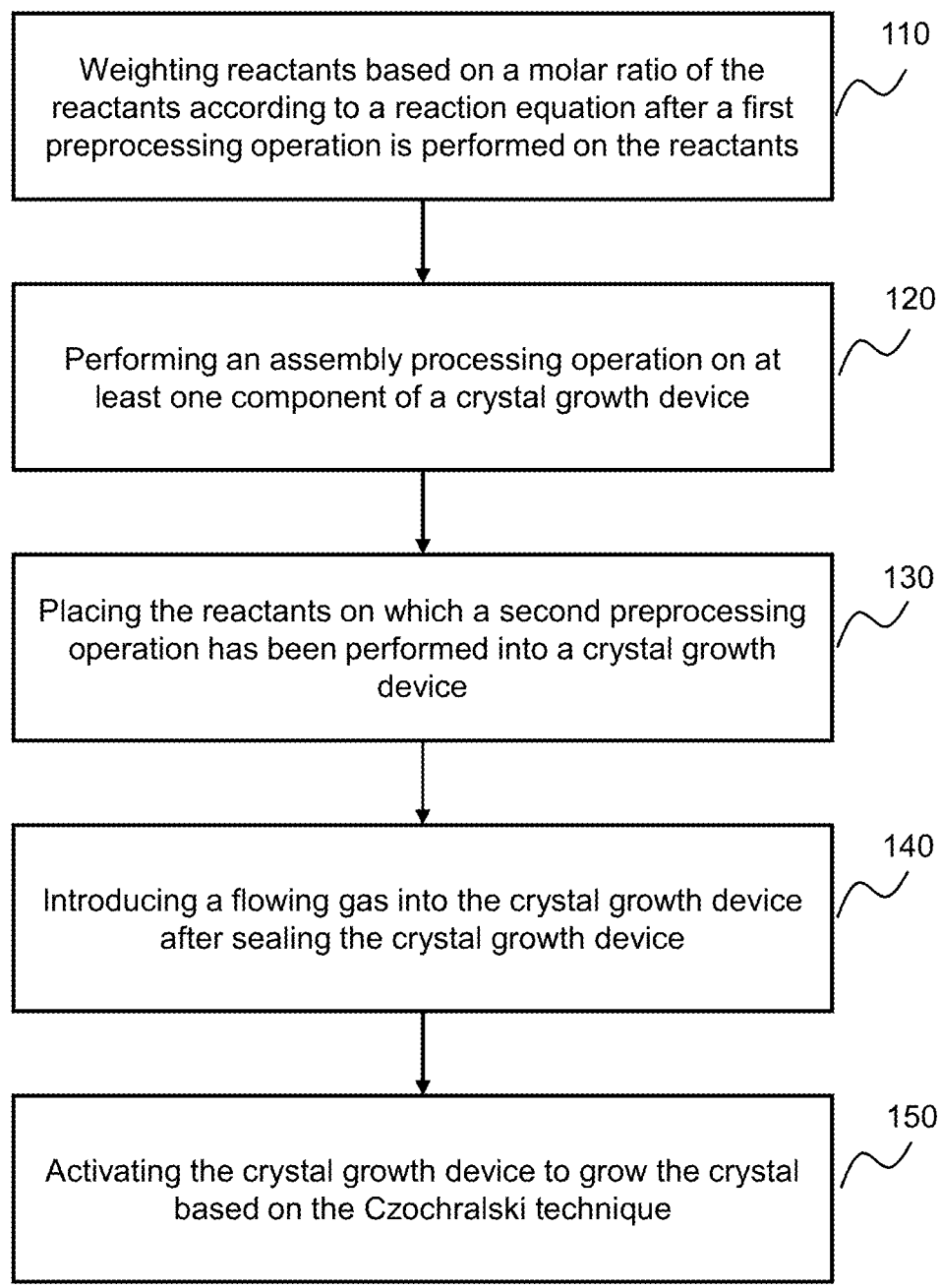
FIG. 1 is a flowchart illustrating an exemplary method for growing a crystal according to some embodiments of the present disclosure.

In the following detailed description, numerous specific details with reference to the accompanying drawings are set forth by way of examples in order to provide a thorough understanding of the relevant disclosure. Various modifications to the disclosed embodiments will be readily apparent to those skilled in the art, and the general principles defined herein may be applied to other embodiments and applications without departing from the spirit and scope of the present disclosure. The identical numerals in the drawings represent same or similar structures or operation, unless the context clearly indicates otherwise.

It will be understood that the term "system," "device," "unit," and/or "module," used herein are one method to distinguish different components, elements, parts, section or assembly of different level in ascending order. However, the terms may be displaced by another expression if they achieve the same purpose.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The range of values used herein in the present disclosure briefly illustrate each value in the range of values.

The flowcharts used in the present disclosure illustrate operations that systems implement according to some embodiments of the present disclosure. It should be noted that the foregoing or the following operations may not be performed in the order accurately. Instead, the steps may be processed in reverse order or simultaneously. Besides, one or more other operations may be added to the flow charts, or one or more operations may be omitted from the flow chart.

FIG. 1 is a flowchart illustrating an exemplary method for growing a crystal according to some embodiments of the present disclosure. In some embodiments, the method shown in process 100 may be implemented based on the Czochralski technique. In some embodiments, a Lutetium(-yttrium) oxyorthosilicate (L(Y)SO) crystal doped with two elements may be prepared using the Czochralski technique via a medium frequency induction heating mode. A crystal growth device may include but is not limited to an open furnace including a temperature field with flowing gas thermal exchange. More descriptions regarding the crystal growth device may be found elsewhere in the present disclosure (e.g., FIGS. 2-10 and the descriptions thereof).

In operation 110, reactants may be weighted based on a molar ratio of the reactants according to a reaction equation after a first preprocessing operation is performed on the reactants. In some embodiments, the first preprocessing operation may include determining whether a package of the reactants is damaged, whether the color and appearance of the reactants are normal, whether a purity of the reactants meet the requirements, performing a high-temperature roasting operation on the reactants, or the like, or any combination thereof. It should be understood that the purity of the reactants may have a great influence on the scintillation performance of the crystal. In order to generate the crystal meeting requirements, the purity of the reactants for growing the crystal may be greater than 99%. Preferably, the purity of the reactants may be greater than 99.9%. More preferably, the purity of the reactants may be greater than 99.99%. More preferably, the purity of the reactants may be greater than 99.999%.

It should be understood that the reactants may also contain an impurity (e.g., water, organic substance) even if a value of the purity of the reactants is high, for example, 99.999%. In order to pure the reactants, the reactants may be placed in a crucible (e.g., a corundum crucible) and encapsulated, and then the high-temperature roasting operation may be performed to remove water and other organic substance(s). The roasting operation may be performed using a commercially available high-temperature roasting device such as a muffle furnace. In some embodiments, a roasting temperature of the reactants may be 100° C.~1200° C. Preferably, the roasting temperature of the reactants may be 200° C.~1200° C. More preferably, the roasting temperature of the reactants may be between 300° C.~1200° C. More preferably, the roasting temperature of the reactants may be 400° C.~1200° C. More preferably, the roasting temperature of the reactants may be 500° C.~1200° C. More preferably, the roasting temperature of the reactants may be 600° C.~1200° C. More preferably, the roasting temperature of the reactants may be 700° C.~1200° C. More preferably, the roasting temperature of the reactants may be 800° C.~1200° C. More preferably, the roasting temperature of the reactants may be 900° C.~1200° C. More preferably, the roasting temperature of the reactants may be 950° C.~1100° C. More preferably, the roasting temperature of the reactants may be 980° C.~1080° C. More preferably, the roasting temperature of the reactants may be 1000° C.~1050° C. More preferably, the roasting temperature of the reactants may be 1200° C. According to characteristics of the different reactants, the time of the high-temperature roasting may be not less than 5 hours. For example, the time of the high-temperature roasting may be 5 hours. After the high-temperature roasting operation is performed on the reactants, the reactants may be naturally cooled to room temperature 35° C. In some embodiments, the L(Y)SO crystal may be grown according to the following reaction equation (1) or the reaction equation (2).

Take a process for growing L(Y)SO crystal doped with two elements as an example, the reaction equation may be denoted by Equation (1) below:

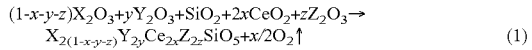

(1)

In some embodiments, X represents at least one of Lu, La, Y, Gd, Pr, Ce, Nd, Pm, Sm, Eu, Tb, Dy, Ho, Er, Tm, Yb, Mn, Mg, Ca, Al, Fe, Sr, or Ba. In the above equation, Ce may include a Ce-containing compound, which may include CeO2, Ce2O3, Ce(CO3)2, CeCl3, CeF3, CeS, CeBr3, CeRu2, CeCo2, CeRh3, CeN, CePd3, CeI3, CeF4, CeCl4, or the like, or any combination thereof. In some embodiments, a value of x may be 0.0001%~6%. Preferably, the value of x may be 0.001%~6%. More preferably, the value of x may be 0.01%~6%. More preferably, the value of x may be 0.1%~6%. More preferably, the value of x may be 0.3%~6%. More preferably, the value of x may be 1%~6%. More preferably, the value of x may be 2%~5%. More preferably, the value of x may be 3%~4%. More preferably, the value of x may be 3.2%~3.8%. More preferably, the value of x may be 3.3%~3.7%. More preferably, the value of x may be 3.4%~3.6%. More preferably, the value of x may be 0.001%~1%. More preferably, the value of x may be 0.01%~1%. More preferably, the value of x may be 0.1%~1%. More preferably, the value of x may be 0.1%~0.6%. More preferably, the value of x may be 0.16%. A value of y may be 0%~100%. Preferably, the value of y may be 0.001%~50%. More preferably, the value of y may be 0.01%~50%. More preferably, the value of y may be 0.1%~50%. More preferably, the value of y may be 15%~35%. More preferably, the value of y may be 20%~30%. More preferably, the value of y may be 22%~28%. More preferably, the value of y may be 23%~27%. More preferably, the value of y may be 24%~26%. More preferably, the value of y may be 0.01%~30%. More preferably, the value of y may be 0.1%~30%. More preferably, the value of y may be 1%~30%. More preferably, the value of y may be 5%~30%. More preferably, the value of y may be 10%. A value of z may be 0.0001~6%. More preferably, the value of z may be 0.001~6%. More preferably, the value of z may be 0.01~6%. More preferably, the value of z may be 0.1~6%. More preferably, the value of z may be 0.3~6%. More preferably, the value of z may be 1~6%. More preferably, the value of z may be 2~5%. More preferably, the value of z may be 3~4%. More preferably, the value of z may be 3.1~3.9%. More preferably, the value of z may be 3.3~3.7%. More preferably, the value of z may be 3.4~3.6%. More preferably, the value of z may be 0.001%~1%. More preferably, the value of z may be 0.01%~1%. More preferably, the value of z may be 0.1%~1%. More preferably, the value of z may be 0.1%~0.6%. More preferably, the value of z may be 0.1%. Merely by way of example, Z may represent an element such as lithium (Li), boron (B), gallium (Gd), etc.

Take a process for growing Lutetium oxyorthosilicate crystal doped with two elements as an example, the reaction equation may be denoted by Equation (2) below:

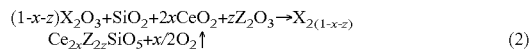
$$(1-x-z)X_2O_3+SiO_2+2xCeO_2+zZ_2O_3 \rightarrow X_{2(1-x-z)}Ce_{2x}Z_{2z}SiO_5+x/2O_2\uparrow \quad (2)$$

In some embodiments, X represents at least one of Lu, La, Y, Gd, Pr, Ce, Nd, Pm, Sm, Eu, Tb, Dy, Ho, Er, Tm, Yb, Mn, Mg, Ca, Al, Fe, Sr, or Ba. In some embodiments, Ce in the reaction equations (2) may include a Ce-containing compound, which may include $CeO_2$, $Ce_2O_3$, $Ce(CO_3)_2$, $CeCl_3$, $CeF_3$, $CeS_7$ $CeBr_3$, $CeRu_2$, $CeCo_2$, $CeRh_3$, $CeN$, $CePd_3$, $CeI_3$, $CeF_4$, $CeCl_4$, or the like, or any combination thereof. In some embodiments, a value of x may be 0.0001%~6%. Preferably, the value of x may be 0.001%~6%. More preferably, the value of x may be 0.01%~6%. More preferably, the value of x may be 0.1%~6%. More preferably, the value of x may be 0.3%~6%. More preferably, the value of x may be 1%~6%. More preferably, the value of x may be 2%~5%. More preferably, the value of x may be 3%~4%. More preferably, the value of x may be 3.2%~3.8%. More preferably, the value of x may be 3.3%~3.7%. More preferably, the value of x may be 3.4%~3.6%. More preferably, the value of x may be 0.001%~1%. More preferably, the value of x may be 0.01%~1%. More preferably, the value of x may be 0.1%~1%. More preferably, the value of x may be 0.1%~0.6%. More preferably, the value of x may be 0.16%. A value of z may be 0.0001~6%. More preferably, the value of z may be 0.001~6%. More preferably, the value of z may be 0.01~6%. More preferably, the value of z may be 0.1~6%. More preferably, the value of z may be 0.3~6%. More preferably, the value of z may be 1~6%. More preferably, the value of z may be 2~5%. More preferably, the value of z may be 3~4%. More preferably, the value of z may be 3.1~3.9%. More preferably, the value of z may be 3.3~3.7%. More preferably, the value of z may be 3.4~3.6%. More preferably, the value of z may be 0.001%~1%. More preferably, the value of z may be 0.01%~1%. More preferably, the value of z may be 0.1%~1%. More preferably, the value of z may be 0.1%~0.6%. More preferably, the value of z may be 0.1%. In some embodiments, a Ce/Li:LSO crystal or a Ce/B:LSO crystal may be prepared using the same or similar reaction equation.

It can be understood that during the growth of the crystal, silicon dioxide ($SiO_2$) may volatilize under a heating condition, which may cause composition deviation of the generated crystal, composition difference among crystals generated in different times, and a poor growth repeatability. According to some embodiments of the present disclosure, an excessive amount of silicon dioxide may be used to avoid composition deviation and poor growth repeatability caused by the volatilization of the silicon dioxide to a certain extent.

In some embodiments, a weight of the silicon dioxide may excess of 0.01%~10% of a total weight as determined according to the reaction equation Preferably, the weight of the silicon dioxide may excess of 0.1%~10% of its weight. More preferably, the weight of the silicon dioxide may excess of 1%~10% of its weight. More preferably, the weight of the silicon dioxide may excess of 2%~9% of its weight. More preferably, the weight of the silicon dioxide may excess of 3%~8% of its weight. More preferably, the weight of the silicon dioxide may excess of 4%~7% of its weight. More preferably, the weight of the silicon dioxide may excess of 5%~6% of its weight. More preferably, the weight of the silicon dioxide may excess of 0.01%~1% of its weight. More preferably, the weight of the silicon dioxide may excess of 0.05%~5% of its weight. More preferably, the weight of the silicon dioxide may excess of 0.05%~3% of its weight. More preferably, the weight of the silicon dioxide may excess of 2% of its weight. More preferably, the weight of the silicon dioxide may excess of 0.2% of its weight.

In operation 120, an assembly processing operation may be performed on at least one component of a crystal growth device. In some embodiments, the at least one component of the crystal growth device may include a single crystal growth furnace, a temperature field device, a pulling component, a rotation component, a weighing component, a heat source, a cooling component, a flowing gas component, a control component, an medium frequency power supply, or the like, or any combination thereof. The single crystal growth furnace may be configured to provide a space for the crystal growth. The temperature field device may be used in the single crystal growth furnace to provide a temperature gradient for the crystal growth, and ensure the stability of a crystallization process of the crystal. The temperature field device may include a first hollow column and two cover plates covering two ends of the first hollow column, respectively. Specifically, two cover plates may be connected to the two ends of the first hollow column. A second hollow column with a height less than that of the first hollow column may be mounted inside the first hollow column. A space between the first hollow column and the second hollow column and/or a space in the second hollow column may be filled with a substance (also referred to as a filler) used for heat preservation. For example, the space between the first hollow column and the second hollow column and the space in the second hollow column may be filled with the substance. As another example, the space between the first hollow column and the second hollow column may be filled with a substance used for heat preservation, and the space in the second hollow column may not be filled with the substance. As a further example, the space between the first hollow column and the second hollow column may not be filled with the substance, and the space in the second hollow column may be filled with the substance. The substance filled in the second hollow column may also be configured to support a crucible used for holding the reactants. Merely by way of example, the substance for heat preservation may include zircon sand, zirconia particles, alumina particles, zirconia felt, etc. More descriptions regarding the crystal growth device may be found elsewhere in the present disclosure (e.g., FIGS. 2-9 and descriptions thereof), which are not repeated here. The pulling component may be configured to drive a pulling rod assembly to move up and down. The rotation component may be configured to drive a rotation of the pulling rod assembly. The weighing component may be configured to determine the weight of crystal on the pulling rod assembly. The heat source may be configured to heat and melt the reactants. The cooling component may be configured to reduce heat radiation dissipated from the temperature field device and prevent a furnace body from being damaged by excessive heat. The flowing gas component may be configured to introduce a flowing gas into the temperature field device, which can stabilize the temperature gradient of the temperature field device and suppress the volatilization of the reactants (e.g., $SiO_2$) to a certain extent, thereby reducing the composition deviation of the crystal during the crystal growth. Merely by way of example, the flowing gas may include oxygen, nitrogen, inert gas, or the like, or any combination thereof. For example, the flowing gas may include nitrogen. As another example, the flowing gas may include nitrogen and oxygen.

In some embodiments, the assembly processing operation may include determining whether a component of the crystal growth device is normal. The component may be maintained in response to a determination that the component is not normal. In some embodiments, the assembly processing operation may include checking the sealing of the temperature field device to ensure that the temperature field can maintain a stable temperature. One or more components (e.g., the bottom plate, the first cover plate, a sealing ring) of the temperature field device may be adjusted to improve the sealing of the temperature field device.

Figure 2:
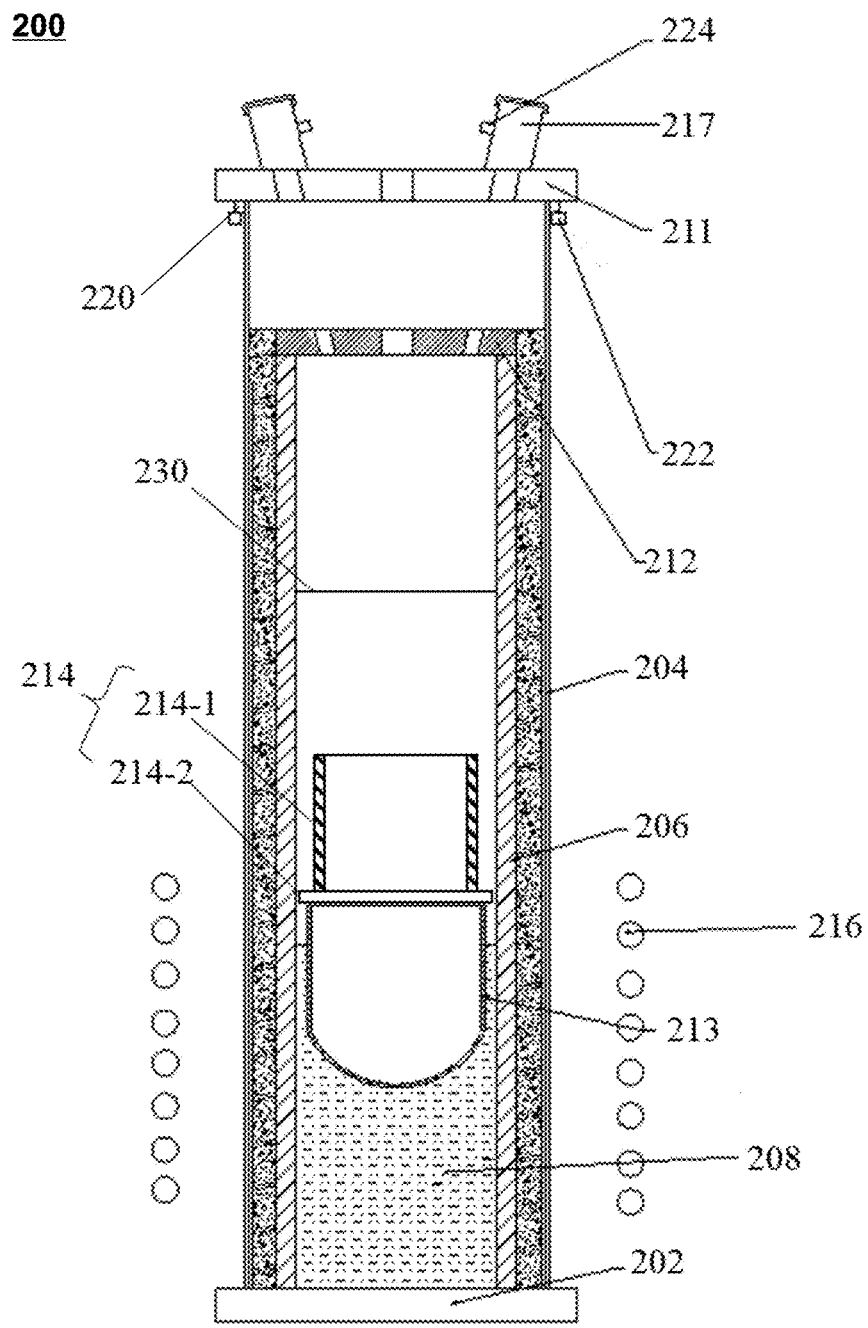
FIG. 2 is a schematic diagram illustrating an exemplary temperature field device according to some embodiments of the present disclosure.

In some embodiments, the temperature field device may include a crucible (e.g., a crucible 213 shown in FIG. 2). The assembly processing operation may also include, for example, an acid soaking and cleaning operation, a detection operation for detecting a relative position of the crucible and the induction coil, an impurity cleaning operation, or the like, or any combination thereof, which may be performed on the crucible. Specifically, the acid soaking and cleaning operation may include soaking the crucible in an acid (e.g., hydrochloric acid, hydrofluoric acid) with a concentration of 1%~15% for 0.5 hours~5 hours, cleaning the crucible with water and ultrasound for 10 minutes 30 minutes, and drying the crucible. The detection operation for detecting the relative position of the crucible and the induction coil may include determining whether a vertical distance between an upper edge of the crucible and an upper edge of an induction coil which is mounted outside the temperature field device is 0 mm~±50 mm. In some embodiments, the vertical distance between the upper edge of the crucible and the upper edge of the induction coil may be ±20 mm, wherein "+" represents that the upper edge of the crucible is higher than the upper edge of the induction coil, and "~" represents that the upper edge of the crucible is lower than the upper edge of the induction coil. In response to a determination that the relative distance is not 0 mm~±50 mm, a position of the crucible may be adjusted by adjusting an amount and a tightness of the filler filled in the second hollow column. In some embodiments, the impurity cleaning operation may include cleaning the impurity in the crucible using a vacuum cleaner and repeatedly scrubbing an inner wall of the crucible with alcohol which may have a concentration of 75%~99.999%. Exemplary impurity may include condensates, volatiles, etc. that fall onto the pulling rod in the crucible.

In some embodiments, the assembly processing operation may include cleaning the temperature field device. Specifically, the crucible may be covered with a cardboard (e.g., a cardboard 230 shown in FIG. 2), and an inner wall of the first hollow column and/or the second hollow column may be cleaned, such as scraping off the impurity on the inner wall, scrubbing the inner wall, removing the impurity using a vacuum cleaner, or the like, or any combination thereof.

In operation 130, the reactants may be placed into the crystal growth device after a second preprocessing operation is performed on the reactants. In some embodiments, the second preprocessing operation may include an ingredient mixing operation, a pressing operation, a raw material detection operation, or the like, or any combination thereof. In some embodiments, the reactants may be mixed after that the reactants are naturally cooled to 20° C.~35° C. after the high-temperature roasting operation is performed on the reactants. It can be understood that uniformly mixed reactants may be conducive to the subsequent growth of the crystal. Exemplary mixing device may include, but is not limited to a three-dimensional motion mixer, a double cone mixer, a vacuum mixer, a coulter mixer, a V mixer, a conical twin-screw screw mixer, a planetary mixer, a horizontal screw mixer, etc. A mixing time of the reactants may be 0.5 hours~48 hours. Preferably, the mixing time may be 1 hour~48 hours. More preferably, the mixing time may be 6 hours~42 hours. More preferably, the mixing time may be 12 hours~36 hours. More preferably, the mixing time may be 18 hours~30 hours. More preferably, the mixing time may be 21 hours~27 hours.

The pressing operation may refer to an operation in which a certain pressure may be applied to the reactants to transform the reactants from a dispersed state into a body with an initial shape for example, a cylindrical shape. The pressed reactants may have a volume smaller than that of the reactants in the dispersed state and may be easier to be put into a reaction device (e.g., a reaction crucible) in one time. Meanwhile, the pressing operation may discharge the air contained in the reactants in the dispersed state to reduce an impact of the air on the crystal growth in subsequent reactions. Meanwhile, the pressing operation may discharge the air contained in the reactants in the dispersed state to reduce an impact of the air on the crystal growth in subsequent reactions. The pressing operation may be performed by an isostatic pressing device such as cold isostatic pressing device. The reactants may be placed in a pressing tank and pressed into the body with the initial shape. The pressure used during the pressing operation may be 100 MPa~300 MPa. Preferably, the pressure used during the pressing operation may be 150 MPa~250 MPa. More preferably, the pressure used during the pressing operation may be 160 MPa~240 MPa. More preferably, the pressure used during the pressing operation may be 170 MPa~230 MPa. More preferably, the pressure used during the pressing operation may be 180 MPa~220 MPa. More preferably, the pressure used during the pressing operation may be 190 MPa~210 MPa. More preferably, the pressure used during the pressing operation may be 200 MPa.

The raw material detection operation may refer to an operation in which whether a package of the pressed reactants is damaged and whether the color and/or appearance of the pressed reactants is normal may be determined, thereby determining the purity of the reactants.

In operation 140, a flowing gas may be introduced into the crystal growth device after the crystal growth device is sealed. In some embodiments, the sealing of the crystal growth device may refer to that except for necessary contact, there is no gas exchange between the crystal growth device and the atmospheric environment. For example, a hearth of an open single crystal growth furnace may be opened and an operator (e.g., a worker) may directly observe the temperature field device in the open single crystal growth furnace, whereas, the temperature field device should be sealed and have no gas exchange with the atmospheric environment. As another example, an interior of a vacuum single crystal growth furnace may be vacuum, and the crystal growth device may have no gas exchange with the atmospheric environment. To realize the seal of the crystal growth device, a sealing ring, vacuum grease, and/or other sealing material may be mounted at joints among various components of the crystal growth device. It can be understood that a suitable protective gas may reduce volatilization of a reactant (e.g., silicon oxide) to a certain extent, thereby solving a problem of deviation of crystal components during the crystal growth. In some embodiments, the flowing gas may be introduced into the crystal growth device (e.g., the temperature field device) after the crystal growth device is sealed. The flowing gas may refer to a gas that enters from an inlet of the crystal growth device and flows out from an outlet of the crystal growth device. The flowing gas may include oxygen, nitrogen, an inert gas, or the like, or any combination thereof. In some embodiments, when the flowing gas is a mixed gas of oxygen and nitrogen, a volume ratio of oxygen may be 0.001%~10%. Preferably, the volume ratio of oxygen may be 0.01%~10%. More preferably, the volume ratio of oxygen may be 0.1%~10%. More preferably, the volume ratio of oxygen may be 1%~10%. More preferably, the volume ratio of oxygen may be 2%~9%. More preferably, the volume ratio of oxygen may be 3%~8%. More preferably, the volume ratio of oxygen may be 4%~7%. More preferably, the volume ratio of oxygen may be 5%~6%. To ensure that the flowing gas may not affect the reactants, for example, to bring in an impurity, a purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When introducing the flowing gas to the crystal growth device, a flow rate of the flowing gas may be 0.01 L/min~50 L/min. Preferably, the flow rate of the flowing gas may be 0.1 L/min~50 L/min. More preferably, the flow rate of the flowing gas may be 1 L/min~50 L/min. More preferably, the flow rate of the flowing gas may be 5 L/min~45 L/min. More preferably, the flow rate of the flowing gas may be 10 L/min~40 L/min. More preferably, the flow rate of the flowing gas may be 15 L/min~35 L/min. More preferably, the flow rate of the flowing gas may be 20 L/min~30 L/min. More preferably, the flow rate of the flowing gas may be 21 L/min~29 L/min. More preferably, the flow rate of the flowing gas may be 22 L/min~28 L/min. More preferably, the flow rate of the flowing gas may be 23 L/min~27 L/min. More preferably, the flow rate of flowing gas may be 24 L/min~26 L/min.

In operation 150, the crystal growth device may be activated and the crystal growth may be executed based on the Czochralski technique. In some embodiments, the activating of the crystal growth device may include energizing and/or introducing a cooling liquid. A high temperature is required during the crystal growth, a plenty of heat radiation may be generated to the external environment. Further, since the crystal growth time (e.g., four days to forty days) is relatively long, the heat radiation may affect the performance of the crystal growth device. Accordingly, the cooling liquid may be used to reduce the heat radiation. The cooling liquid may include water, ethanol, ethylene glycol, isopropanol, n-hexane, or the like, or any combination thereof. The Czochralski technique disclosed in the present disclosure may include a melting process, a seed crystal preheating process, a seeding process, a temperature adjustment process, a necking process, a shouldering process, an constant diameter growth process, an ending process, a cooling process, a crystal removing process, etc.

The reactants may be used for the crystal growth after being melted by heating. After being energized, a medium frequency induction coil mounted in the single crystal growth furnace may heat the crucible to melt the reactants in the crucible. The melting process may refer to a process in which the temperature may be increased to a certain value via a temperature increasing process, the reactants may be melted to form a melt, and a certain temperature (i.e., temperature gradient) can be kept in the crystal growth device. The temperature gradient may refer to a change rate of the temperature at a certain point toward a temperature of an adjacent point in the crystal growth device, which may also be referred to as a change rate of the temperature per unit distance. Merely by way of example, a temperature change from a point A to a point B is (T1−T2), and a distance between the two points is (r1−r2), and the temperature gradient from the point A to the point B is $\Delta T=(T1-T2)/(r1-r2)$. During the crystal growth, a suitable temperature gradient is needed. For example, during the crystal growth, a large enough temperature gradient $\Delta T$ along a vertical direction is need, which can disperse the latent heat of crystallization generated during the crystal growth, thereby keep the crystal growth stable. Meanwhile, a temperature of the melt below a growth interface should be higher than a crystallization temperature, so that the local growth of crystal would not be too fast and the growth interface would be stable, thereby keeping the growth stable. The temperature gradient may be determined based on a location of a heating center. For example, the temperature in the heating center may be higher than that of other positions away from the heating center and the temperature of a point away from the growth interface may be lower than that of points close to the growth interface. Since the height of the temperature field device is limited, in order to keep a large enough $\Delta T$ in the vertical direction during the crystal growth, the height of the heating center in the vertical direction may be adjusted. In some embodiments, the reactants placed in the crucible may be melt from a wall to a center of the crucible. In some embodiments, a melting time of the reactants may be 10 hours~30 hours. In some embodiments, a temperature increasing rate may be adjusted by adjusting an output power of the power supply to control the temperature gradient and further to control the melting time of the reactants. Merely by way of example, it is assumed that the output power of the power supply in a previous crystal growth is 2500 W, the temperature increasing rate for a current crystal growth may be adjusted as 800 W/h~2500 W/h. In some embodiments, when a diameter of reactants which have not been melted is 45 mm~55 mm, the adjustment of the output power may be stopped to maintain a constant temperature, accordingly, the temperature field may be in a temperature balance state within a temperature maintenance time. The temperature maintenance time may be set as 0.5 hours~1 hour. In some embodiments, the output power of the power supply may be adjusted based on the diameter of the reactants which have not been melted in the crucible. In response to a determination that the diameter of the reactants which have not been melted are not 1 mm~10 mm, the output power of the power supply may be increased by 50 W~300 W and the temperature maintenance time may be set as 0.5 h~1 h to melt the reactants. In some embodiments, during melting the reactants, when a surface of the reactants in the crucible is flush with or slightly lower than an upper edge of the crucible, a distance between a heater and the second hollow column may be monitored to determine a concentricity of the heater and the temperature field device. In response to that a deviation of the concentricity of the heater and the temperature field device is greater than a deviation threshold, the position of the heater (e.g., a heater shown in FIG. 2) may be adjusted, for example, via an elongated object with a 7-shaped plug which may be made of high temperature resistant material (e.g., iridium). In some embodiments, a temperature increasing time of the reactants may be 24 h. In some embodiments, a density of the melt may be 6 g/cm³~6.5 g/cm³ during the melting process. Preferably, the density of the melt may be 6.15 g/cm³. More preferably, the density of the melt may be 6.3 g/cm³.

The seed crystal preheating process may refer to a process in which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. In some embodiments, the seed crystal may be preprocessed by an acid. For example, the seed crystal may be soaked in a diluted hydrochloric acid with a concentration of 1%~15% for 5 minutes~30 minutes. In some embodiments, the seed crystal may be dropped into the temperature field via the pulling rod. A dropping speed of the seed crystal may be 50 mm/h~800 mm/h. In some embodiments, the pulling rod may be connected to a weighing guide rod, and a concentricity between the seed crystal, the pulling rod, and the weighing guide rod may be adjusted. The seed crystal may be dropped into the temperature field via the pulling rod. During the seed crystal preheating process, a distance between the seed crystal and an upper surface of the reactants may be 5 mm~15 mm. Preferably, the distance between the seed crystal and the upper surface of the reactants may be 6 mm~14 mm. More preferably, the distance between the seed crystal and the upper surface of the reactants may be 7 mm~13 mm. More preferably, the distance between the seed crystal and the upper surface of the reactants may be 8 mm~12 mm. More preferably, the distance between the seed crystal and the upper surface of the reactants may be 9 mm~11 mm. In some embodiments, the distance between the seed crystal and the upper surface of the reactants may be maintained within a predetermined distance, so that the reactants can be prevented from contacting with the seed crystal before being melted to a certain diameter (e.g., 20 mm). In some embodiments, the seed crystal may be prepared based on the Czochralski technique. In some embodiments, the seed crystal may include L(Y)SO with any crystal orientation and doped with a rare earth element (e.g., lanthanum (La), cerium (Ce), praseodymium (Pr), neodymium (Nd)). Take cerium-doped Lutetium oxyorthosilicate (Ce:LSO) as an example, the reaction equation may be denoted by an Equation below:

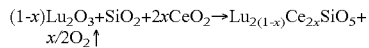

$(1-x)Lu_2O_3 + SiO_2 + 2xCeO_2 \rightarrow Lu_{2(1-x)}Ce_{2x}SiO_5 + x/2O_2 \uparrow$ The seeding process may refer to a process in which the pulling rod may be dropped to cause the seed crystal to contact with a melt after the reactants are melted to form the melt. After the reactants are completely melted or a diameter of the reactants which have not been melted is 1 mm~10 mm, the dropping speed of the seed crystal may be set as 5 mm/h~100 mm/h, thereby causing a lower end of the seed crystal to contact with the melt.

The temperature adjustment process may refer to a process in which a temperature in the crystal growth device may be adjusted to a suitable temperature for the crystal growth. In some embodiments, an operator may determine whether the temperature is suitable for the crystal growth by observing a solid-liquid interface of the seed crystal. In some embodiments, the operator may observe the solid-liquid interface of the seed crystal through an observing unit (e.g., an observing unit shown in FIG. 2). If a phenomenon such as a bright and thick aperture, a vibration of the aperture, a severe fluctuation of the melt surface occurs after the seed crystal is connected with the melt, it may indicate that the temperature may be higher than a suitable temperature for the crystal growth. If no aperture occurs intermediately or a phenomenon such as an incomplete aperture, the seed crystal not being fused, the seed crystal growing up occurs after the seed crystal is connected with the melt, it may indicate that the temperature may be lower than a suitable temperature for the crystal growth. If the aperture slowly occurs (e.g., 2-3 minutes) after the seed crystal is connected with the melt, it may indicate that the temperature is suitable for the crystal growth. The temperature may be adjusted by adjusting the output power of the power supply. After the temperature is adjusted as a suitable temperature, the seed crystal may be sunk by 0.1 mm~50 mm based on a parameter (e.g., size, length) of the seed crystal. Preferably, the seed crystal may be sunk by 0.5 mm~5 mm. More preferably, the seed crystal may be sunk by 1 mm~5 mm. More preferably, the seed crystal may be sunk by 1.5 mm~5 mm. More preferably, the seed crystal may be sunk by 2 mm~4.5 mm. More preferably, the seed crystal may be sunk by 3 mm~4 mm. More preferably, the seed crystal may be sunk by 3.2 mm~3.8 mm. More preferably, the seed crystal may be sunk by 3.4 mm~3.6 mm. More preferably, the seed crystal may be sunk by 2 mm. In some embodiments, after the temperature adjustment, the temperature inside the crystal growth device may at least be kept for 0.1 hours~1 hours. Then, the pulling rod may be pulled up. In some embodiments, an automatic control program for growing the crystal may be activated after the pulling rod is automatically pulled up for 5 minutes~10 minutes based on a predetermined pulling rate and/or a predetermined pulling height. The predetermined pulling rate may be 1 mm/h~3 mm/h and the predetermined pulling height may be 0.1 mm~2 mm. In some embodiments, whether process parameters of the automatic control program are accurate and/or suitable may be determined. Exemplary process parameters may include appearance parameters (e.g., a size, a length, a shape, etc. of the seed crystal), a shoulder angle of the crystal, a shoulder length of the crystal, a diameter of the crystal, a length of the crystal, a rotation rate of the pulling rod corresponding to the length of the crystal, a pulling speed corresponding to the length of the crystal, PID parameters corresponding to the length of the crystal, a crystal density, a melt density, a geometric dimension of the crucible, ending process parameters, cooling parameters, or the like, or any combination thereof. In a subsequent crystal growth process, the rotation rate of the pulling rod may be 0.01 rpm~35 rpm. More preferably, the rotation rate of the pulling rod may be 0.1 rpm/min~35 rpm/min. More preferably, the rotation rate of the pulling rod may be 1 rpm/min~35 rpm/min. More preferably, the rotation rate of the pulling rod may be 5 rpm/min~30 rpm/min. More preferably, the rotation rate of the pulling rod may be 10 rpm/min~25 rpm/min. More preferably, the rotation rate of the pulling rod may be 15 rpm/min~20 rpm/min. More preferably, the rotation rate of the pulling rod may be 10 rpm/min. The pulling speed of the pulling rod may be 1.5 mm/h.

The necking process may refer to a process in which the temperature may be slowly increased to cause a temperature of a zero point of the melt to be slightly higher than the melting point of the crystal, a diameter of a newly grown crystal during the rotation and pulling up of the seed crystal may be gradually decreased. The necking process may reduce the extension of crystal dislocations from the seed crystal to a single crystal below a neck. The shouldering processing may refer to a process in which when atoms or molecules on a solid-liquid interface at a boundary between the seed crystal and the melt begin to be arranged in a structure of the seed crystal, the temperature in the temperature field may be slowly decreased according to a real-time growth rate of the crystal to expand the seed crystal according to a preset angle. In some embodiments, a shoulder angle may be 30 degrees~70 degrees. Preferably, the shoulder angle may be 40 degrees~60 degrees. More preferably, the shoulder angle may be 45 degrees~55 degrees. More preferably, the shoulder angle may be 46 degrees~54 degrees. More preferably, the shoulder angle may be 47 degrees~53 degrees. More preferably, the shoulder angle may be 48 degrees~52 degrees. More preferably, the shoulder angle may be 49 degrees~51 degrees. A shoulder length may be 40 mm~90 mm. Preferably, the shoulder length may be 50 mm~80 mm. More preferably, the shoulder length may be 60 mm~70 mm. More preferably, the shoulder length may be 60 mm. More preferably, the shoulder length may be 75 mm.

The constant diameter growth process may refer to a process in which a rod-like structure with a diameter determined during the shouldering process may be obtained. In some embodiments, the constant diameter of the crystal may be determined based on a size of the crucible and a crystal diameter. The larger the size of the crucible is, the larger crystal diameter may be, and the larger the constant diameter may be. A length of constant diameter may be greater than 200 mm. In some embodiments, the length of the constant diameter of the crystal growth may be 10 mm~200 mm. Preferably, the length of the constant diameter of the crystal growth may be 20 mm~180 mm. More preferably, the length of the constant diameter of the crystal growth may be 50 mm~150 mm. More preferably, the length of the constant diameter of the crystal growth may be 60 mm~140 mm. More preferably, the length of the constant diameter of the crystal growth may be 70 mm~130 mm. More preferably, the length of the constant diameter of the crystal growth may be 80 mm~120 mm. More preferably, the length of the constant diameter of the crystal growth may be 90 mm~110 mm. More preferably, the length of the constant diameter of the crystal growth may be 200 mm.

The ending process may refer to a process in which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod. In some embodiments, an ending angle may be 30 degrees~70 degrees. Preferably, the ending angle may be 40 degrees~60 degrees. More preferably, the ending angle may be 45 degrees~55 degrees. More preferably, the ending angle may be 46 degrees~54 degrees. More preferably, the ending angle may be 47 degrees~53 degrees. More preferably, the ending angle may be 48 degrees~52 degrees. More preferably, the ending angle may be 49 degrees 51 degrees. An ending length of the crystal may be 40 mm~90 mm. More preferably, the ending length of the crystal may be 50 mm~80 mm. More preferably, the ending length of the crystal may be 60 mm~70 mm. More preferably, the ending length of the crystal may be 30 mm. More preferably, the ending length of the crystal may be 60 mm.

The cooling process may refer to a process in which a temperature may be slowly decreased (e.g., the temperature may be decreased naturally) after the ending process is completed, to eliminate a stress within the crystal, which may be formed in the high-temperature crystal growth. The cooling process may prevent cracking of the crystal caused by a sudden drop of the temperature. In some embodiments, after the ending process is completed, the medium frequency power supply may be automatically or manually turned off, the flowing gas may be turned off, and the cooling process may be executed. A cooling time of the crystal may be 20 hours~100 hours. Preferably, the cooling time of the crystal may be 30 hours~90 hours. More preferably, the cooling time of the crystal may be 40 hours~80 hours. More preferably, the cooling time of the crystal may be 50 hours~70 hours. More preferably, the cooling time of the crystal may be 55 hours~65 hours. More preferably, the cooling time of the crystal may be 60 hours. More preferably, the cooling time of the crystal may be 100 hours. In some embodiments, a decreasing rate of the crystal temperature may be 15° C./h~95° C./h. More preferably, the decreasing rate of the crystal temperature may be 20° C./h~65° C./h. More preferably, the decreasing rate of the crystal temperature may be 23° C./h~47° C./h. More preferably, the decreasing rate of the crystal temperature may be 26° C./h~38° C./h. More preferably, the decreasing rate of the crystal temperature may be 28° C./h~34° C./h.

The crystal removing process may refer to a process in which the grown crystal may be taken out from the crystal growth device when an internal temperature of the crystal growth device drops to the room temperature. In some embodiments, a time period that the internal temperature of the crystal growth device is decreased to the room temperature may be 10 h~30 h. In some embodiments, the crystal may be removed by loosening the pulling rod and pulling away a distance.

In the crystal growth process, according to a setting of various process parameters in different stages of the crystal growth process, the growth rate of the crystal may be 0.01 mm/h~6 mm/h. Preferably, the growth rate of the crystal may be 0.1 mm/h~6 mm/h. More preferably, the growth rate of the crystal may be 1 mm/h~6 mm/h. More preferably, the growth rate of the crystal may be 2 mm/h~5 mm/h. More preferably, the growth rate of the crystal may be 3 mm/h~4 mm/h. A diameter of an obtained crystal may be 60 mm~75 mm (e.g., 60 mm, 65 mm, 70 mm, 75 mm, etc.). In some embodiments, a time period of the crystal growth process may be 16 days. In some embodiments, the time period of the crystal growth process may be 14 days.

In some embodiments, one or more processes in the crystal growth may be controlled by a PID controller. The one or more process may include but are not limited to the necking process, the shouldering process, the constant diameter growth process, the ending process, the cooling process, etc. In some embodiments, the PID parameter may be 0.1~5. Preferably, the PID parameter may be 0.5~4.5. More preferably, the PID parameter may be 1~4. More preferably, the PID parameter may be 1.5~3.5. More preferably, the PID parameter may be 2~3. More preferably, the PID parameter may be 2.5~3.5. More preferably, the PID parameter may be 2~3. More preferably, the PID parameter may be 0.5.

In some embodiments, a diameter of a removed crystal may be 60 mm~75 mm. Preferably, the diameter of the removed crystal may be 60 mm. More preferably, the diameter of the removed crystal may be 65 mm. More preferably, the diameter of the removed crystal may be 70 mm. More preferably, the diameter of the removed crystal may be 75 mm. In some embodiments, a constant diameter of the removed crystal may be 160 mm~200 mm. Preferably, the constant diameter of the removed crystal may be 160 mm. More preferably, the constant diameter of the removed crystal may be 200 mm. In some embodiments, the removed crystal has no macro defects such as crystal cracking, a wrapping material, etc. In some embodiments, a density of the removed crystal may be 7.15 g/cm³~7.4 g/cm³. Preferably, the density of the removed crystal may be 7.25 g/cm³. More preferably, the density of the removed crystal may be 7.4 g/cm³. Lattice parameters of the removed crystal are a=1.4254 nm, b=0.6641 nm, c=1.0241 nm, and/or β=122°12"~122°20". Preferably, the lattice parameters of the removed crystal are a=1.4254 nm, b=0.6641 nm, c=1.0241 nm, and β=122°12". More preferably, the lattice parameters of the removed crystal are a=1.4254 nm, b=0.6641 nm, c=1.0241 nm, and β=122°20". In some embodiments, an effective atomic number may be 66. In some embodiments, a transmittance of the removed crystal from ultraviolet, visible light, to near-infrared band is greater than 75%. In some embodiments, the transmittance of the removed crystal from ultraviolet, visible light, to near-infrared band is greater than 80%. In some embodiments, a center wavelength of a light emitted from the crystal may be 420 nm. In some embodiments, a refractive index of the removed crystal may be 1.82. In some embodiments, a light yield of the removed crystal may be greater than 45000 ph/MeV. The light yield of the crystal may be greater than 48000 ph/MeV. The light yield of the crystal may be greater than 50000 ph/MeV. The light yield of the crystal may be greater than 60000 ph/MeV. In some embodiments, an energy resolution of the removed crystal may be less than or equal to 6%~9%. More preferably, the energy resolution of the removed crystal may be less than or equal to 9%. In some embodiments, a decay time of the removed crystal may be less than 45 ns. In some embodiments, the decay time of the crystal may be less than 42 ns. In some embodiments, a radiation length of the removed crystal may be 1.14/cm. In some embodiments, a scintillation efficiency of the removed crystal may be 70%~75%. In some embodiments, a radiation hardness of the removed crystal may be higher than a hardness threshold. The radiation hardness may be greater than 106.

In some embodiments, the removed crystal may include a Ce/Li:LSO crystal. A diameter of the Ce/Li:LSO crystal is 65 mm. A length of the Ce/Li:LSO crystal is 190 mm. A melting point of the of the Ce/Li:LSO crystal is 1980° C. The Ce/Li:LSO crystal is colorless. A concentration of Ce in the Ce/Li:LSO crystal is 0.25 at %. A concentration of Li in the Ce/Li:LSO crystal is 0.03 at %. The crystal lattice parameters are a=1.4277 nm, b=0.6639 nm, c=1.0246 nm, and/or β=122.22°. A density of the Ce/Li:LSO crystal is 7.4 g/cm³. A luminescence center of the Ce/Li:LSO crystal is about 400 nm. An emission center of the Ce/Li:LSO crystal is about 360 nm. A decay time of the Ce/Li:LSO crystal is less than 36 ns.

In some embodiments, the removed crystal may include a Ce/Mg:LSO crystal. A diameter of the Ce/Mg:LSO crystal is 75 mm. A length of the Ce/Mg:LSO crystal is 160 mm. A melting point of the of the Ce/Mg:LSO crystal is 1980° C. The Ce/Mg:LSO crystal is colorless. A concentration of Ce in the Ce/Mg:LSO crystal is 0.25 at %. A concentration of Mg in the Ce/Mg:LSO crystal is 0.02 at %. A decay time of the Ce/Mg:LSO crystal is less than 39 ns. A light yield of the Ce/Mg:LSO crystal is 38024 ph/MeV.

In some embodiments, the removed crystal may include a Ce/Ca:LSO crystal. A diameter of the Ce/Ca:LSO crystal is 78 mm. A length of the Ce/Ca:LSO crystal is 150 mm. A melting point of the of the Ce/Ca:LSO crystal is 1980° C. The Ce/Ca:LSO crystal is colorless. A concentration of Ce in the Ce/Ca:LSO crystal is 0.22 at %. A concentration of Ca in the Ce/Ca:LSO crystal is 0.02 at %. An energy resolution of the Ce/Ca: LSO crystal is 9%~10%. A decay time of the Ce/Ca: LSO crystal is less than 41 ns. A light yield of the Ce/Ca:LSO crystal is 38800 ph/MeV.

In some embodiments, the removed crystal may include a Ce/Ca/Zn:LSO crystal. The Ce/Ca/Zn:LSO crystal is colorless. A concentration of Ca in the Ce/Ca/Zn:LSO crystal is 0.4 at %. A concentration of Zn in the Ce/Ca/Zn:LSO crystal is 0.2 at %. A concentration of Ce in the Ce/Ca/Zn:LSO crystal is 0.1 at %. A decay time of the Ce/Ca/Zn:LSO crystal is 28.9 ns. A light yield of the Ce/Ca/Zn:LSO crystal is 29900 ph/MeV.

In some embodiments, the removed crystal may include a Ce/Tb:LSO crystal. A diameter of the Ce/Tb: LSO crystal is 80 mm. A length of the Ce/Tb: LSO crystal is 150 mm. A melting point of the of the Ce/Tb:LSO crystal is 1970° C. The Ce/Tb:LSO crystal is colorless or have a green color. A concentration of Ce in the Ce/Tb:LSO crystal is 0.2 at %. A concentration of Tb in the Ce/Tb:LSO crystal is 1/3 at %. A light yield of the Ce/Tb:LSO crystal is 16000 ph/MeV. A decay time of the Ce/Tb:LSO crystal is less than 34 ns.

In some embodiments, the removed crystal may include a Ce:LGSO crystal. The Ce:LGSO crystal may belong to a monoclinic crystal system. Lattice parameters of the Ce:LGSO crystal may include that a=1.449 nm, b=0.6767 nm, c=1.0528 nm, and/or β=122.17°. A concentration of Ce in the Ce:LGSO crystal is 0.44 at %. The Ce:LGSO crystal may belong to a space group C2/c. A density of the Ce:LGSO crystal is 7.3 g/cm³. An effective atomic number of the Ce:LGSO crystal is 63. The Ce:LGSO crystal may have no hygroscopic property. The Ce:LGSO crystal may have self-radiating property. A light yield of the Ce:LGSO crystal is 16700±1700 ph/MeV. A count of photoelectrons of the Ce:LGSO crystal is 4030±100 phe/MeV. An energy resolution of the Ce:LGSO crystal is 7.2%±0.2%. A decay time of the Ce:LGSO crystal is 30.6 ns. A peak wavelength of the Ce: LGSO crystal is 410 nm.

In some embodiments, the removed crystal may include a Ce/Tb:LYSO crystal. The Ce/Tb:LYSO crystal may belong to a space group B2/c. Lattice parameters of the Ce/Tb: LYSO crystal may include that a=1.441 nm, b=0.673 nm, c=1.043 nm, and/or β=122.2°. An average size of effective crystal particles of the Ce/Tb:LYSO crystal is 122.9 nm. An internal stress of the Ce/Tb:LYSO crystal is 1.5×10⁻³. A concentration of Ce in the Ce/Tb:LYSO crystal is 0.05 at %. A concentration of Tb in the Ce/Tb:LYSO crystal is 0.25 at %. A decay time of the Ce/Tb:LYSO crystal is 18 ns. A luminescence center of the Ce/Tb:LYSO crystal is about 425 nm or 544 nm.

In some embodiments, the removed crystal may include a Ce/Ca:LYSO crystal. Lattice parameters of the Ce/Ca:LYSO crystal may include that a=1.426 nm, b=0.6635 nm, c=1.0242 nm, β=122.202°, and/or α=γ=90°. A melting point of the Ce/Ca: LYSO crystal is 2050° C. The Ce/Ca: LYSO crystal may belong to a space group C2/c. A Mohs hardness of the Ce/Ca:LYSO crystal is 5.8. A density of the Ce/Ca: LYSO is 7.1 g/cm³. The Ce/Ca: LYSO crystal may belong to a monoclinic crystal system. A decay time of the Ce/Ca: LYSO crystal is 33 ns. An energy resolution of the Ce/Ca: LYSO crystal is 8.1%. A light yield of the Ce/Ca:LYSO crystal is 9600 phe/MeV. A time resolution of the Ce/Ca: LYSO crystal is 267±8 ps. An emission peak of the crystal is 420 nm.

In some embodiments, the removed crystal may include a Ce/Ca:GSO crystal. Lattice parameters of the Ce/Ca:GSO crystal may include that a=0.9121 nm, b=0.7089 nm, c=0.6738 nm, and/or β=107.66°. A density of the Ce/Ca:GSO crystal is 6.7 g/cm³. An effective atomic number of the Ce/Ca:GSO crystal is 58. The Ce/Ca:GSO crystal may have no hygroscopic property. The crystal may have self-radiating property. A decay time of the Ce/Ca:GSO crystal is 30 ns~60 ns. A light yield of the Ce/Ca:GSO crystal is 32130±92 ph/MeV. A cut-off wavelength of the Ce/Ca:GSO crystal is 430 nm.

In some embodiments, the removed crystal may include Ce:GYSO crystal.

Lattice parameters of the Ce:GYSO crystal are a=0.912 nm, b=0.703 nm, c=0.674 nm, and/or β=107.49°. A density of the Ce:GYSO crystal is 6.56 g/cm³. An effective atomic number of the Ce:GYSO crystal is 56. The Ce:GYSO crystal may belong to a space group P21/C. The Ce:GYSO crystal is colorless. An emission peak of the Ce:GYSO crystal is 440 nm. A light yield of the Ce:GYSO crystal is 11200 ph/MeV. An energy resolution of the Ce:GYSO crystal is 8.6%. A decay time of the Ce:GYSO crystal is 44 ns.

In some embodiments, a formula of the crystal may be

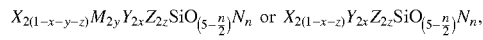

wherein x=0.0001%~6%, y=0%~100%, z=0.0001~6%, and a value of n may be 0~5. X may consist of at least one of an element or one or more compounds containing Ce. The element may include Lu, La, Y, Gd, Pr, Ce, Nd, Pm, Sm, Eu, Tb, Dy, Ho, Er, Tm, Yb, Mn, Mg, Ca, Al, Fe, Sr, or Ba. The one or more compounds containing Ce may include $CeO_2$, $Ce_2O_3$, $Ce(CO_3)_2$, $CeCl_3$, $CeF_3$, CeS, $CeBr_3$, $CeRu_2$, $CeCO_2$, $CeRh_3$, CeN, $CePd_3$, $CeI_3$, $CeF_4$, or $CeCl_4$. Y may consist of at least one of Ce, Cl, F, Br, N, P, or S. M may include at least one of Sc, Y, Gd, or Lu. N may consist of at least one of Cl, F, Br, or S. $SiO_5^{2-}$ may include Cl—, F—, Br—, or S—.

In some embodiments, a value of x may be 0.0001%~6%. Preferably, the value of x may be 0.001%~6%. More preferably, the value of x may be 0.01%~6%. More preferably, the value of x may be 0.1%~6%. More preferably, the value of x may be 0.3%~6%. More preferably, the value of x may be 1%~6%. More preferably, the value of x may be 2%~5%. More preferably, the value of x may be 3% 4%. More preferably, the value of x may be 3.2%~3.8%. More preferably, the value of x may be 3.3%~3.7%. More preferably, the value of x may be 3.4%~3.6%. More preferably, the value of x may be 0.001%~1%. More preferably, the value of x may be 0.01%~1%. More preferably, the value of x may be 0.1%~1%. More preferably, the value of x may be 0.1%~0.6%. More preferably, the value of x may be 0.16%. A value of y may be 0%~100%. Preferably, the value of y may be 0.001%~50%. More preferably, the value of y may be 0.01%~50%. More preferably, the value of y may be 0.1%~50%. More preferably, the value of y may be 15%~35%. More preferably, the value of y may be 20%~30%. More preferably, the value of y may be 22%~28%. More preferably, the value of y may be 23%~27%. More preferably, the value of y may be 24%~26%. More preferably, the value of y may be 0.01%~30%. More preferably, the value of y may be 0.1%~30%. More preferably, the value of y may be 1%~30%. More preferably, the value of y may be 5%~30%. More preferably, the value of y may be 10%. A value of z may be 0.0001~6%. Preferably, the value of z may be 0.001~6%. More preferably, the value of z may be 0.01~6%. More preferably, the value of z may be 0.1~6%. More preferably, the value of z may be 0.3~6%. More preferably, the value of z may be 1~6%. More preferably, the value of z may be 2~5%. More preferably, the value of z may be 3~4%. More preferably, the value of z may be 3.1~3.9%. More preferably, the value of z may be 3.3~3.7%. More preferably, the value of z may be 3.4~3.6%. More preferably, the value of z may be 0.001%~1%. More preferably, the value of z may be 0.01%~1%. More preferably, the value of z may be 0.1%~1%. More preferably, the value of z may be 0.1%~0.6%. More preferably, the value of z may be 0.1%.

In some embodiments, a composition deviation of the crystal may be analyzed by analyzing tailings (e.g., a color of the tailings). In some embodiments, the composition deviation of the crystal may be analyzed by detecting the crystal property.

In some embodiments, neutrons may be indirectly regulated and/or detected based on an energy emitted by a reaction between the neutrons and other elements of the crystal. In some embodiments, some elements (e.g., Li, B) may capture the neutrons and emit radiation (e.g., α particles) which may be easily detected, accordingly, the neutrons may be detected. In some embodiments, the neutrons may elastically collide with a nucleus to cause the nucleus to move in an opposite direction, which may be detected by a fast neutron detector, accordingly, the neutrons may be detected.

It should be noted that the embodiments mentioned above are only used to illustrate the technical solutions of the present disclosure but not to limit the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

FIG. 2 is a schematic diagram illustrating an exemplary temperature field device according to some embodiments of the present disclosure. It should be noted that FIG. 2 is provided for illustration purposes and does not limit the shape and/or structure of the temperature field device. The temperature field device 200 may include a bottom plate (e.g., a bottom plate 202), at least one cover plate (e.g., a first cover plate 211 and/or a second cover plate 212), at least on drum (e.g., a first drum 204 and/or a second drum 206), a filler (e.g., a filler 208), and/or a crucible (e.g., a crucible 213). The temperature field device 200 may be mounted in a crystal growth device to provide temperature gradient for crystal growth and ensure the stability of a crystallization process of the crystal. As shown in FIG. 2, the temperature field device 200 may include the bottom plate 202, the first drum 204, the second drum 206, the filler 208, the first cover plate 211, the second cover plate 212, the crucible 213, a heater 214, an induction coil 216, an observing unit 217, a sealing ring 220, a pressure ring 222, and a gas channel 224. The heater 214 may include a first heater 214-1 and a second heater 214-2. The temperature field device 200 may be placed in the crystal growth device such as a single crystal growth furnace. Specifically, the temperature field device 200 may be placed in an induction coil 216 in the single crystal growth, and the crucible 213 may be placed in the temperature field device 200.

The bottom plate 202 may be mounted on a bottom of the temperature field device 200 to support other components of the temperature field device 200, for example, the first drum 204, the second drum 206, the filler 208, etc. In some embodiments, a material of the bottom plate 202 may include a heat reflective material with a relatively high reflection coefficient, for example, gold, silver, nickel, aluminum foil, copper, molybdenum, coated metal, or the like, or any combination thereof. Preferably, the bottom plate 202 may include a copper plate. In some embodiments, a diameter of the bottom plate 202 may be 200 mm~500 mm. Preferably, the diameter of the bottom plate 202 may be 250 mm~450 mm. More preferably, the diameter of the bottom plate 202 may be 300 mm~400 mm. More preferably, the diameter of the bottom plate 202 may be 310 mm~390 mm. More preferably, the diameter of the bottom plate 202 may be 320 mm~380 mm. More preferably, the diameter of the bottom plate 202 may be 430 mm~370 mm. More preferably, the diameter of the bottom plate 202 may be 440 mm~360 mm. In some embodiments, a thickness of the bottom plate 202 may be 10 mm~40 mm. Preferably, the thickness of the bottom plate 202 may be 15 mm~35 mm. More preferably, the thickness of the bottom plate 202 may be 20 mm~30 mm. More preferably, the thickness of the bottom plate 202 may be 21 mm~29 mm. More preferably, the thickness of the bottom plate 202 may be 22 mm~28 mm. More preferably, the thickness of the bottom plate 202 may be 23 mm~27 mm. More preferably, the thickness of the bottom plate 202 may be 24 mm~26 mm. Since the temperature field device 200 may be placed in a furnace body of the single crystal growth furnace, the bottom plate 202 may be placed or mounted on a mounting plate of the furnace body. A mode of placing or disposing the bottom plate 202 may include a welding mode, a riveting mode, a bolting mode, a bonding mode, or the like, or any combination thereof. A level of the bottom plate 202 may be less than 0.02. Preferably, the level of the bottom plate 202 may be less than 0.015. More preferably, the level of the bottom plate 202 may be less than 0.01. More preferably, the level of the bottom plate 202 may be less than 0.009. More preferably, the level of the bottom plate 202 may be less than 0.008. More preferably, the level of the bottom plate 202 may be less than 0.007. More preferably, the level of the bottom plate 202 may be less than 0.006. More preferably, the level of the bottom plate 202 may be less than 0.005. More preferably, the level of the bottom plate 202 may be 0.005. When the temperature field device 200 is used, an internal temperature may reach a relatively high temperature, for example, 1900° C. Therefore, it is necessary to reduce heat radiation of the temperature field device 200 to prevent the furnace body from being damaged by excessive heat. In this case, the bottom plate 202 may be provided with channel(s) for circulation cooling fluid which may be used to absorb the heat inside the temperature field device 200, thereby insulating the heat and reducing the heat radiation. The channel(s) may be mounted inside the bottom plate 202 with a spiral shape or a snake shape. The cooling liquid may include water, ethanol, ethylene glycol, isopropyl alcohol, n-hexane or the like, or any combination thereof. Merely by way of example, the cooling liquid may include a 50:50 mixed liquid of water and ethanol. A count of the circulating cooling liquid channel(s) may be one or more, for example, 1~3. In some embodiments, diameter(s) of the circulating cooling liquid channel(s) may be 5 mm~25 mm. Preferably, the diameter(s) of the circulating cooling liquid channel(s) may be 10 mm~20 mm. More preferably, the diameter(s) of the circulating cooling liquid channel(s) may be 11 mm~19 mm. More preferably, the diameter(s) of the circulating cooling liquid channel(s) may be 12 mm~18 mm. More preferably, the diameter(s) of the circulating cooling liquid channel(s) may be 13 mm~17 mm. More preferably, the diameter(s) of the circulating cooling liquid channel(s) may be 14 mm~15 mm.

The first drum 204 may be mounted on the bottom plate 202 and constitute an outer wall of the temperature field device 200. The bottom plate 202 may cover an open end of the first drum 204. The first drum 204 may be mounted on the bottom plate 202 via a welding mode, a riveting mode, a bolting mode, a bonding mode, or the like, or any combination thereof, to support the temperature field device 200. The first drum 204 may achieve the sealing and the heat preservation of the temperature field device 200 together with other components (e.g., the bottom plate 202, the first cover plate 112) of the temperature field device 200. When the first drum 204 is being mounted, a concentricity of the first drum 204 and the bottom plate 202 may be less than 0.5 mm. Preferably, the concentricity of the first drum 204 and the bottom plate 202 may be less than 0.4 mm. More preferably, the concentricity of the first drum 204 and the bottom plate 202 may be less than 0.3 mm. More preferably, the concentricity of the first drum 204 and the bottom plate 202 may be less than 0.2 mm. More preferably, the concentricity of the first drum 204 and the bottom plate 202 may be less than 0.1 mm. A perpendicularity of the first drum 204 and the bottom plate 202 may be less than 0.2 degrees. Preferably, the perpendicularity of the first drum 204 and the bottom plate 202 may be less than 0.15 degrees. More preferably, the perpendicularity of the first drum 204 and the bottom plate 202 may be less than 0.1 degrees. More preferably, the perpendicularity of the first drum 204 and the bottom plate 202 may be less than 0.05 degrees. More preferably, the perpendicularity of the first drum 204 and the bottom plate 202 may be less than 0.03 degrees. The first drum 204 may be made of quartz, alumina (e.g., corundum), zirconia, graphite, carbon fiber, or the like, or any combination thereof. According to a size of the bottom plate 202, an inner diameter of the first drum 204 may be 180 mm~450 mm. Preferably, the inner diameter of the first drum 204 may be 200 mm~530 mm. More preferably, the inner diameter of the first drum 204 may be 220 mm~510 mm. More preferably, the inner diameter of the first drum 204 may be 250 mm~380 mm. More preferably, the inner diameter of the first drum 204 may be 270 mm~360 mm. More preferably, the inner diameter of the first drum 204 may be 300 mm~330 mm. More preferably, the inner diameter of the first drum 204 may be 310 mm~320 mm. In some embodiments, a thickness of the first drum 204 be 1 mm~15 mm. Preferably, the thickness of the first drum 204 be 3 mm~12 mm. More preferably, the thickness of the first drum 204 may be 5 mm~10 mm. More preferably, the thickness of the first drum 204 may be 6 mm~9 mm. More preferably, the thickness of the first drum 204 may be 7 mm~8 mm. A height of the first drum 204 may be 600 mm~1600 mm. Preferably, the height of the first drum 204 may be 700 mm~1500 mm. More preferably, the height of the first drum 204 may be 800 mm~1400 mm. More preferably, the height of the first drum 204 may be 900 mm~1300 mm. More preferably, the height of the first drum 204 may be 1000 mm~1200 mm. More preferably, the height of the first drum 204 may be 1050 mm~1150 mm. More preferably, the height of the first drum 204 may be 1060 mm~1140 mm. More preferably, the height of the first drum 204 may be 1070 mm~1130 mm. More preferably, the height of the first drum 204 may be 1080 mm~1120 mm. More preferably, the height of the first drum 204 may be 1090 mm~1110 mm. More preferably, the height of the first drum 204 may be 1095 mm~1105 mm. The second drum 206 may be disposed in the first drum 204. In some embodiments, the second drum 206 may be made of a material with relatively good heat resistance to maintain a temperature of the crystal growth stable. The second drum 206 may be made of zirconia, alumina, graphite, ceramics, etc. More preferably, the second drum 206 may include a zirconium drum made of zirconia. To match with the size of the first drum 204, an inner diameter of the second drum 206 may be 70 mm~300 mm. Preferably, the inner diameter of the second drum 206 may be 100 mm~270 mm. More preferably, the inner diameter of the second drum 206 may be 120 mm~250 mm. More preferably, the inner diameter of the second drum 206 may be 150 mm~220 mm. More preferably, the inner diameter of the second drum 206 may be 170 mm~200 mm. More preferably, the inner diameter of the second drum 206 may be 180 mm~270 mm. A thickness of the second drum 206 may be 10 mm~30 mm. Preferably, the thickness of the second drum 206 may be 15 mm~25 mm. More preferably, the thickness of the second drum 206 may be 16 mm~24 mm. More preferably, the thickness of the second drum 206 may be 17 mm~23 mm. More preferably, the thickness of the second drum 206 may be 18 mm~22 mm. More preferably, the thickness of the second drum 206 may be 19 mm~21 mm. In some embodiments, an end of the second drum 206 may be placed or mounted on the bottom plate 202, for example, via a bonding connection, a welding connection, a riveting connection, a key connection, a bolting connection, a buckle connection, or the like, or any combination thereof. A concentricity of the second drum 206 and the bottom plate 202 may be less than 0.5 mm. Preferably, the concentricity of the second drum 206 and the bottom plate 202 may be less than 0.4 mm. More preferably, the concentricity of the second drum 206 and the bottom plate 202 may be less than 0.3 mm. More preferably, the concentricity of the second drum 206 and the bottom plate 202 may be less than 0.2 mm. More preferably, the concentricity of the second drum 206 and the bottom plate 202 may be less than 0.1 mm. More preferably, the concentricity of the second drum 206 and the bottom plate 202 may be less than 0.05 mm. A perpendicularity of the second drum 206 may be less than 0.2 degrees. Preferably, the perpendicularity of the second drum 206 may be less than 0.15 degrees. More preferably, the perpendicularity of the second drum 206 may be less than 0.1 degree. More preferably, the perpendicularity of the second drum 206 may be less than 0.08 degrees. More preferably, the perpendicularity of the second drum 206 may be less than 0.05 degrees. In some embodiments, when the second drum 206 is mounted on the bottom plate 202, according to different heights, the second drum 206 may be in different mounting states. When the height of the second drum 206 is the same as that of the first drum 204, the mounting state of the second drum 206 may be similar to that of the first drum 204, that is, an open end of the second drum 206 may be connected to the bottom plate 202 and the other open end may be connected to the first cover plate 112.

In some embodiments, the second drum 206 may be mounted at the bottom plate 202, the second drum 206 may be in different mounting state responding to its height. When the height of the second drum 206 is the same as that of the first drum 204, the mounting state of the second drum 206 may be similar to that of the first drum 204, an open end of the second drum 206 may be connected to the bottom plate 202, and the other open end may be connected to the first cover plate 211. When the height of the second drum 206 is less than that of the first drum 204, the other open end of the second drum 206 may be connected to other components (e.g., the second cover plate 212) of the temperature field device 200. The second cover plate 212 may cover the other open end of the second drum 206. Meanwhile, a size and/or a shape (e.g., a diameter of a circle cover plate) of the second cover plate 212 may match a cross section of the first drum 204 to achieve a seamless connection with the first drum 204. In some embodiments, the second drum 206 may not be mounted on the bottom plate 202. When the height of the second drum 206 is less than that of the first drum 204, an end of the second drum 206 may be mounted on other components (e.g., the first cover plate 211, the second cover plate 212) of the temperature field device 200, and the other end of the second drum 206 may be kept at a certain distance from the bottom plate 202 (e.g., in a floating state). In some embodiments, the height of the second drum 206 may be the same as or similar to that of the first drum 204. The height of the second drum 206 may be 500 mm~1500 mm. Preferably, the height of the second drum 206 may be 600 mm~1400 mm. More preferably, the height of the second drum 206 may be 700 mm~1300 mm. More preferably, the height of the second drum 206 may be 800 mm~1200 mm. More preferably, the height of the second drum 206 may be 900 mm~1100 mm. More preferably, the height of the second drum 206 may be 950 mm~1050 mm. More preferably, the height of the second drum 206 may be 960 mm~1040 mm. More preferably, the height of the second drum 206 may be 970 mm~1030 mm. More preferably, the height of the second drum 206 may be 980 mm~1020 mm. More preferably, the height of the second drum 206 may be 990 mm~1010 mm.

The filler 208 may be filled in the second drum 206, and/or a space between the first drum 204 and the second drum 206. The filler 208 may be configured for heat preservation. In some embodiments, a height and/or a tightness of the filler 208 may change a position of a component (e.g., the crucible 213) supported by the filler 208 and/or a space volume of the heat dissipation in temperature field device 200.

The filler 208 filled in the second filler 206 may be at least used to support the crucible 213 and cover at least a portion of the crucible 213. Different stable temperature gradients for different crystal growths may be obtained by changing the height and/or the tightness of the filler 208. The height of the filler 208 may determine a position of a heating center, which may affect the temperature gradient above a melt interface in a vertical direction. A particle size and/or a tightness of the filler 208 may determine the heat insulation capacity of the filler 208 (e.g., the smaller the particle size is and the larger the tightness is, the stronger the heat insulation capacity and the stability may be), which may affect the temperature gradient below the melt interface in the vertical direction. Different heights, and/or tightness of the filler 208 may correspond to different temperature gradients. In some embodiments, when the second drum 206 is cracked, the filler 208 filled in the space between the first drum 204 and the second drum 206 may act as a heat insulation layer to prevent a change caused by a communication between the temperature field device 200 and the external environment, which may affect the crystal growth. The heat insulation layer formed by the filler 208 may maintain the temperature gradient in the temperature field device 200 in the above-mentioned case to avoid the sudden change of the temperature. A shape of the filler 208 may include granular. The filler 208 may include zircon sand (zirconium silicate compound), zirconia particles, alumina particles, etc. A particle size of the filler 208 may be 5 mesh~200 mesh. Preferably, the particle size of the filler 208 may be 10 mesh~190 mesh. More preferably, the particle size of the filler 208 may be 20 mesh~180 mesh. More preferably, the particle size of the filler 208 may be 30 mesh~170 mesh. More preferably, the particle size of the filler 208 may be 40 mesh~160 mesh. More preferably, the particle size of the filler 208 may be 50 mesh~150 mesh. More preferably, the particle size of the filler 208 may be 60 mesh~140 mesh. More preferably, the particle size of the filler 208 may be 70 mesh~130 mesh. More preferably, the particle size of the filler 208 may be 80 mesh~120 mesh. More preferably, the particle size of the filler 208 may be 90 mesh~110 mesh. More preferably, the particle size of the filler 208 may be 95 mesh~105 mesh.

In some embodiments, the filler 208 filled in the second drum 206 may be used to support the crucible 213 containing the reactants for the crystal growth. The filler 208 may cover a portion of the crucible 213, for example, a bottom and a side wall of the crucible 213. To prevent the filler 208 from falling into the reactants in the crucible 213, an upper edge of the crucible 213 may be higher than the filling height of the filler 208 filled in the second drum 206. In some embodiments, the second drum 206 may prevent the filler 208 filled in the space between the first drum 204 and the second drum 206 from falling into the crucible 213. In some embodiments, the crucible 213 may be made of iridium (Ir), molybdenum (Mo), tungsten (W), rhenium (Re), graphite (C), tungsten-molybdenum alloy, or the like, or any combination thereof. Preferably, the crucible 213 may be made of iridium. In some embodiments, a diameter of the crucible 213 may be 60 mm~250 mm. Preferably, the diameter of the crucible 213 may be 80 mm~220 mm. More preferably, the diameter of the crucible 213 may be 100 mm~200 mm. More preferably, the diameter of the crucible 213 may be 110 mm~190 mm. More preferably, the diameter of the crucible 213 may be 120 mm~180 mm. More preferably, the diameter of the crucible 213 may be 130 mm~170 mm. More preferably, the diameter of the crucible 213 may be 140 mm~160 mm. More preferably, the diameter of the crucible 213 may be 145 mm~155 mm. More preferably, the diameter of the crucible 213 may be 180 mm. More preferably, the diameter of the crucible 213 may be 120 mm. A thickness of the crucible 213 may be 2 mm 4 mm. Preferably, the thickness of the crucible 213 may be 2.2 mm~3.8 mm. More preferably, the thickness of the crucible 213 may be 2.5 mm~3.5 mm. More preferably, the thickness of the crucible 213 may be 2.6 mm~3.4 mm. More preferably, the thickness of the crucible 213 may be 2.7 mm~3.3 mm. More preferably, the thickness of the crucible 213 may be 2.8 mm~3.2 mm. More preferably, the thickness of the crucible 213 may be 2.9 mm~3.1 mm. A height of the crucible 213 may be 60 mm~250 mm. Preferably, the height of the crucible 213 may be 80 mm~220 mm. More preferably, the height of the crucible 213 may be 100 mm~200 mm. More preferably, the height of the crucible 213 may be 110 mm~190 mm. More preferably, the height of the crucible 213 may be 120 mm~180 mm. More preferably, the height of the crucible 213 may be 130 mm~170 mm. More preferably, the height of the crucible 213 may be 140 mm~160 mm. More preferably, the height of the crucible 213 may be 145 mm~155 mm. More preferably, the height of the crucible 213 may be 180 mm. More preferably, the height of the crucible 213 may be 120 mm.

The sealing ring 220 and/or the pressure ring 222 may achieve a seal between the first drum 204 and the first cover plate 211. In some embodiments, the sealing ring 220 may be mounted at a joint between the first drum 204 and the first cover plate 211, which may made of a material having a certain elasticity, for example, silicone, rubber, etc. An inner diameter of the sealing ring 220 may be less than or equal to the outer diameter of the first drum 114, so that when the sealing ring 220 is mounted, the sealing ring 220 may be stretched to seal effectively a gap between the first drum 204 and the first cover plate 211. In some embodiments, the inner diameter of the sealing ring 220 may be 170 mm~540 mm. Preferably, the inner diameter of the sealing ring 220 may be 200 mm~510 mm. More preferably, the inner diameter of the sealing ring 220 may be 250 mm~350 mm. More preferably, the inner diameter of the sealing ring 220 may be 260 mm~340 mm. More preferably, the inner diameter of the sealing ring 220 may be 270 mm~330 mm. More preferably, the inner diameter of the sealing ring 220 may be 280 mm~320 mm. More preferably, the inner diameter of the sealing ring 220 may be 290 mm~310 mm. A wire diameter of the sealing ring 220 may be 5 mm~10 mm. Preferably, the wire diameter of the sealing ring 220 may be 6 mm~9 mm. More preferably, the wire diameter of the sealing ring 220 may be 7 mm~8 mm.

The pressure ring 222 may be configured to perform a fixing and compressing function for the sealing ring 220. In some embodiments, a shape of the pressure ring 222 may match the shape of the first drum 204, and an inner diameter of the pressure ring 222 may be larger than the outer diameter of the first drum 204. The pressure ring 222 may be nested on the first drum 204 and may be movable. The pressure ring 222 may include a threaded hole corresponding to the first cover plate 211. The pressure ring 222 may be connected to the first cover plate 211 via a thread, thereby compressing the sealing ring 220, enlarging a contact surface of the gap between the first drum 204 and the first cover plate 211, causing the contact tightly, and performing an effective sealing function. In some embodiments, one or more items may be used to perform the sealing function, for example, vacuum grease. The sealing ring 220 may be covered with the vacuum grease to perform more effective sealing function. In some embodiments, the pressure ring 222 and the first cover plate 211 may also be connected via a buckle connection. In some embodiments, an outer diameter of the pressure ring 222 may be 200 mm~500 mm. Preferably, the outer diameter of the pressing ring 222 may be 250 mm~450 mm. More preferably, the outer diameter of the pressing ring 222 may be 300 mm~400 mm. More preferably, the outer diameter of the pressing ring 222 may be 310 mm~390 mm. More preferably, the outer diameter of the pressing ring 222 may be 320 mm~380 mm. More preferably, the outer diameter of the pressing ring 222 may be 430 mm~370 mm. More preferably, the outer diameter of the pressing ring 222 may be 440 mm~360 mm. More preferably, the outer diameter of the pressing ring 222 may be 345 mm~355 mm. An inner diameter of the pressure ring 222 may be 190 mm~460 mm. Preferably, the inner diameter of the pressing ring 222 may be 220 mm~530 mm. More preferably, the inner diameter of the pressing ring 222 may be 250 mm~400 mm. More preferably, the inner diameter of the pressing ring 222 may be 280 mm~520 mm. More preferably, the inner diameter of the pressing ring 222 may be 300 mm~400 mm. More preferably, the inner diameter of the pressing ring 222 may be 310 mm~390 mm. More preferably, the inner diameter of the pressing ring 222 may be 320 mm~380 mm. More preferably, the inner diameter of the pressure ring 222 may be 430 mm~370 mm. More preferably, the inner diameter of the pressure ring 222 may be 440 mm~360 mm. More preferably, the inner diameter of the pressure ring 222 may be 345 mm~355 mm. A thickness of the pressing ring 222 may be 8 mm~15 mm. More preferably, the thickness of the pressing ring 222 may be 10 mm~13 mm. More preferably, the thickness of the pressing ring 222 may be 11 mm~12 mm.

In some embodiments, the temperature field device 200 may further include a gas channel. The gas channel may be mounted on the observation unit 217, and a size of the gas channel may match with that of the through hole 520 to form a through tube protruding from the observation unit 217. In this case, the gas channel may be connected to a vent tube to pass the gas into the temperature field device 200.

In some embodiments, the temperature field device 200 may be applied in crystal growth. The reactants for growing crystals may be placed in the crucible 213 for reaction after being weighed and performed a processing operation (e.g., an ingredient mixing operation, an isostatic pressing operation, etc.) according to a reaction equation for preparing the crystal. Different crystal may need different growth conditions, for example, different temperature gradients. Accordingly, the temperature gradient may be adjusted by adjusting an amount and a tightness of the filler 208 (e.g., the filler 208 filled in the second drum 206) filled in the temperature field device 200. For example, the amount of the filler 208 may determine a relative position of the crucible 213 and the induction coil 216, and further determine a heating center of the temperature field device 200. The tightness of the filler 208 may improve the heat preservation capacity of the filler 208 and the stability of the temperature field device 200, which may be beneficial for the crystal growth. After the amount, the particle size, and the tightness of the filler 208 are determined, other components may be mounted and sealed. After the components are mounted, a gas may be introduced into the temperature field device 200, and a cooling fluid may be passed into circulating cooling liquid channel(s), which may be mounted in the bottom plate 202 and the first cover plate 211. Then, the crystal growth device (including the temperature field device 200) may be activated to start the crystal growth. The gas passing into temperature field device 200 may enter from one or more first through holes (e.g., the gas channel(s) 224). The gas exiting the temperature field device 200 may be discharged through the remaining first through holes (e.g., the gas channel(s) 224). After the temperature is adjusted as suitable, an automatic control program may be started to enter an automatic growth mode, through a necking process, a shouldering process, a constant diameter growth process, an ending process, and a cooling process, the crystal growth may be ended after several days (e.g., 10~40 days).

Figure 3:
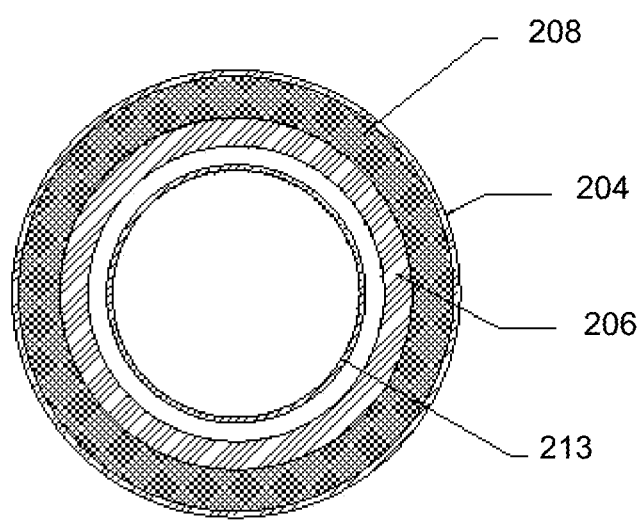
FIG. 3 is a schematic diagram illustrating a top view of a cross-section of an exemplary temperature field device according to some embodiments of the present disclosure.

FIG. 3 is a schematic diagram illustrating a top view of a cross-section of an exemplary temperature field device according to some embodiments of the present disclosure. As shown in FIG. 3, a periphery of the temperature field device 300 may be the first drum 204. The space between the second drum 206 and the first drum 204 may be filled with the filler 208. The crucible 213 may be placed in the second drum 206 and supported by the filler 208 which may be filled at the bottom of the second drum 206. It can be seen that, from outside to inside, components of the temperature field device 300 may successively include the first drum 204, the filler 208, the second drum 206, and the crucible 213. The above-mentioned components may form a concentric circle and a concentricity may be less than 0.5 mm. Preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing the crystal, observing the crystal growth, introducing a flowing gas, and pulling up the crystal.

In some embodiments, the crucible 213 may be used as a heater to melt the reactants contained therein to facilitate subsequent crystal growth. An induction coil (e.g., the induction coil 216 illustrated in FIG. 2) surrounding the outer wall of the first drum 204 may generate an alternating magnetic field when an alternating current with a certain frequency is passed. A closed induced current (i.e., an eddy current) may be generated in a conductor (e.g., crucible 213) caused by the electromagnetic induction of the alternating magnetic field. The induced current may be unevenly distributed on a cross section of the conductor and the electrical energy of a high-density current on a surface of the conductor may be converted into heat energy to increase the temperature of the conductor to melt the reactants. The induction coil 216 may include a coil with 5 turns~14 turns. Preferably, the induction coil 216 may include a coil with 6 turns~13 turns. More preferably, the induction coil 216 may include a coil with 7 turns~12 turns. More preferably, the induction coil 216 may include a coil with 8 turns~11 turns. More preferably, the induction coil 216 may include a coil with 9 turns~10 turns. An inner diameter of a cylinder enclosed by the induction coil 216 may be 180 mm~430 mm. Preferably, the inner diameter of the cylinder enclosed by the induction coil 216 may be 200 mm~420 mm. More preferably, the inner diameter of the cylinder enclosed by the induction coil 216 may be 220 mm~400 mm. More preferably, the inner diameter of the cylinder enclosed by the induction coil 216 may be 240 mm~380 mm. More preferably, the inner diameter of the cylinder enclosed by the induction coil 216 may be 260 mm~360 mm. More preferably, the inner diameter of the cylinder enclosed by the induction coil 216 may be 280 mm~340 mm. A height of the cylinder enclosed by the induction coil 216 may be 150 mm~350 mm. Preferably, the height of the cylinder enclosed by the induction coil 216 may be 170 mm 330 mm. More preferably, the height of the cylinder enclosed by the induction coil 216 may be 190 mm~310 mm. More preferably, the height of the cylinder enclosed by the induction coil 216 may be 211 mm~300 mm. More preferably, the height of the cylinder enclosed by the induction coil 216 may be 230 mm~280 mm. More preferably, the height of the cylinder enclosed by the induction coil 216 may be 250 mm~260 mm. An induction frequency may be 2 kHz~15 kHz. More preferably, the induction frequency may be 3 kHz~14 kHz. More preferably, the induction frequency may be 4 kHz~13 kHz. More preferably, the induction frequency may be 5 kHz~12 kHz. More preferably, the induction frequency may be 6 kHz~11 kHz. More preferably, the induction frequency may be 7 kHz~10 kHz. More preferably, the induction frequency may be 8 kHz~9 kHz. An induction rated power of the induction coil 216 may be 15 kW~60 kW. Preferably, the induction rated power of the induction coil 216 may be 20 kW~50 kW. More preferably, the induction rated power of the induction coil 216 may be 25 kW~45 kW. More preferably, the induction rated power of the induction coil 216 may be 30 kW~44 kW. More preferably, the induction rated power of the induction coil 216 may be 35 kW~43 kW. More preferably, the induction rated power of the induction coil 216 may be 37 kW~42 kW. More preferably, the induction rated power of the induction coil 216 may be 39 kW~41 kW. In some embodiments, a filling height of the filler 208 may result in that a vertical distance between an upper edge of the crucible 213 and an upper edge of the induction coil 216 is 0 mm~±50 mm, wherein "−" represents that the upper edge of the crucible 213 is lower than the upper edge of the induction coil, and "+" represents that the upper edge of the crucible 213 is higher than the upper edge of the induction coil 216. Preferably, the vertical distance between the upper edge of the crucible 213 and the upper edge of the induction coil 216 may be ±5 mm~±20 mm. More preferably, the vertical distance between the upper edge of the crucible 213 and the upper edge of the induction coil 216 may be ±10 mm~±15 mm. More preferably, the vertical distance between the upper edge of the crucible 213 and the upper edge of the induction coil 216 may be from ±11~±14 mm. The temperature gradient of the temperature field device 300 can be adjusted by changing a relative position between the crucible 213 and the induction coil 216. For example, when the crucible 213 is totally within the coil range of the induction coil 216, the heat generated by the crucible 213 may be relatively large; whereas, when only a portion of the crucible 213 is in the coil range of the induction coil 216, the heat generated by the crucible 213 may be relatively small, accordingly, the heat position and/or a space size of heat dissipation in temperature field device 300 may be determined, and the temperature field device 300 may be further affected.

The first cover plate 211 may be mounted on a top of the temperature field device 300, and may be used to seal the temperature field device 300 together with other components (e.g., the first drum 204). The first cover plate 211 may cover the other open end of the first drum 204. The first cover plate 211 may be connected to the first drum 204 via a welding connection, a riveting connection, a bolting connection, a bonding connection, or the like, or any combination thereof. For example, a silicone sealing ring may be mounted at the joint between the first cover plate 211 and the first drum 204, and a screw may be used to screw and seal them. In some embodiments, the material of the first cover plate 211 may be similar to that of the bottom plate 202. The first cover plate 211 may be made of a material with a relatively high reflection coefficient, for example, gold, silver, nickel, aluminum foil, copper, molybdenum, coated metal, or the like, or any combination thereof. Preferably, the first cover plate 211 may include a copper plate. A concentricity of the first cover plate 211 and the first drum 204 may be less than 0.5 mm. Preferably, the concentricity of the first cover plate 211 and the first drum 204 may be less than 0.4 mm. More preferably, the concentricity of the first cover plate 211 and the first drum 204 may be less than 0.3 mm. More preferably, the concentricity of the first cover plate 211 and the first drum 204 may be less than 0.2 mm. More preferably, the concentricity of the first cover plate 211 and the first drum 204 may be less than 0.1 mm. In some embodiments, a diameter of the first cover plate 211 may be 200 mm~500 mm. More preferably, the diameter of the first cover plate 211 may be 250 mm~450 mm. More preferably, the diameter of the first cover plate 211 may be 300 mm~400 mm. More preferably, the diameter of the first cover plate 211 may be 310 mm~390 mm. More preferably, the diameter of the first cover plate 211 may be 320 mm~380 mm. More preferably, the diameter of the first cover plate 211 may be 430 mm~370 mm. More preferably, the diameter of the first cover plate 211 may be 440 mm~360 mm. In some embodiments, a thickness of the first cover plate 211 may be 10 mm~40 mm. Preferably, the thickness of the first cover plate 211 may be 15 mm~35 mm. Preferably, the thickness of the first cover plate 211 may be 20 mm~30 mm. More preferably, the thickness of the first cover plate 211 may be 21 mm~29 mm. More preferably, the thickness of the first cover plate 211 may be 22 mm~28 mm. More preferably, the thickness of the first cover plate 211 may be 23 mm~27 mm. More preferably, the thickness of the first cover plate 211 may be 24 mm~26 mm. In some embodiments, the first cover plate 211 may include at least two first through holes. The first through hole may be used to pass a gas. For example, the first through hole may constitute a channel for the gas to enter and/or exit the temperature field device 300. The gas may be introduced into the temperature field device 300 through one or more of the first through holes, and the gas may be discharged from the remaining first through holes. In some embodiments, the gas may include oxygen, nitrogen, an inert gas, or the like, or any combination thereof. The inert gas may include nitrogen, helium, neon, argon, krypton, xenon, radon, etc. In some embodiments, the gas may include a mixed gas of oxygen, nitrogen, and/or the inert gas. According to characteristics and/or a size of the crystal to be grown, a flow rate of the flowing gas introduced into the temperature field device 300 may be 0.01 L/min~50 L/min. Preferably, the flow rate of the following gas may be 0.1 L/min~50 L/min. More preferably, the flow rate of the following gas may be 1 L/min~50 L/min. More preferably, the flow rate of the following gas may be 5 L/min~45 L/min. More preferably, the flow rate of the following gas may be 10 L/min~40 L/min. More preferably, the flow rate of the following gas may be 15 L/min~35 L/min. More preferably, the flow rate of the following gas may be 20 L/min~30 L/min. More preferably, the flow rate of the following gas may be 21 L/min~29 L/min. More preferably, the flow rate of the following gas may be 22 L/min~28 L/min. More preferably, the flow rate of the following gas may be 23 L/min~27 L/min. More preferably, the flow rate of the following gas may be 24 L/min~26 L/min.

Figure 4:
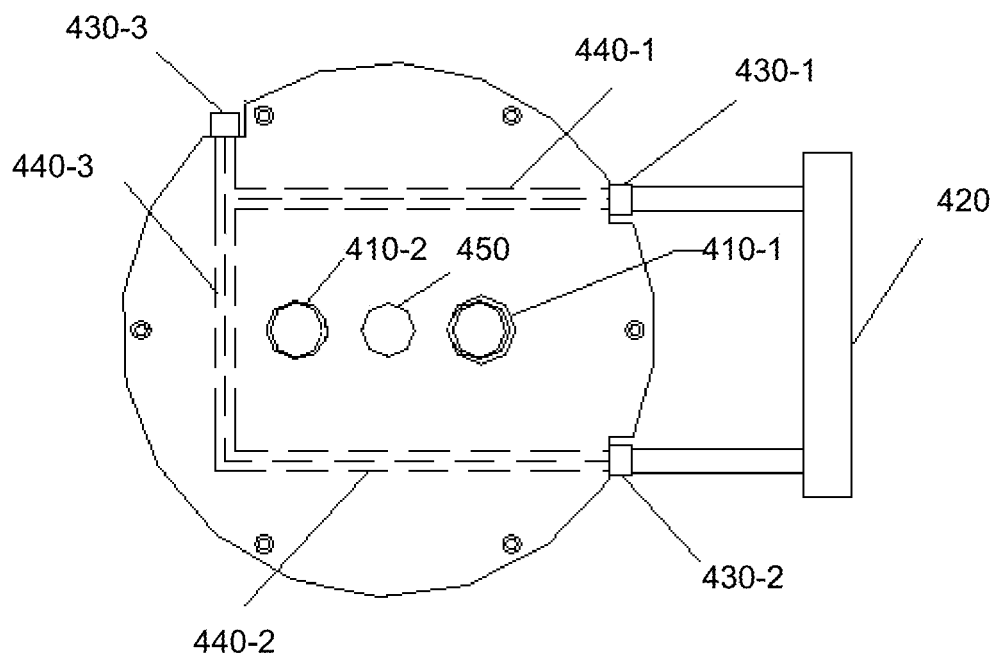
FIG. 4 is a schematic diagram illustrating a top view of an exemplary first cover plate according to some embodiments of the present disclosure.

FIG. 4 is a schematic diagram illustrating a top view of an exemplary first cover plate according to some embodiments of the present disclosure. As shown in FIG. 4, the first cover plate 211 may include two first through holes 410-1 and 410-2 through which a gas may enter and/or exits the temperature field device 200. In some embodiments, diameters of the first through holes 410-1 and 410-2 may be 15 mm~30 mm, respectively. Preferably, the diameters of the first through holes 410-1 and 410-2 may be 18 mm~27 mm, respectively. More preferably, the diameters of the first through holes 410-1 and 410-2 may be 20 mm~25 mm. More preferably, the diameters of the first through holes 410-1 and 410-2 may be 21 mm~24 mm. More preferably, the diameters of the first through holes 410-1 and 410-2 may be 22 mm~23 mm. In some embodiments, rotation central axes of the first through holes 410-1 and 410-2 may be perpendicular to the horizontal plane. In some embodiments, rotation central axes of the first through holes 410-1 and 410-2 may be perpendicular to the horizontal plane. In some embodiments, the rotation central axes of the first through holes 410-1 and 410-2 may be at an angle of 3 degrees~20 degrees with a vertical line of the horizontal plane. Preferably, the rotation central axes of the first through holes 410-1 and 410-2 may be at an angle of 5 degrees~18 degrees with the vertical line of the horizontal plane. More preferably, the rotation central axes of the first through holes 410-1 and 410-2 may be at an angle of 7 degrees~15 degrees with the vertical line of the horizontal plane. More preferably, the central axes of rotation of the first through holes 410-1 and 410-2 may be at an angle of 9 degrees~13 degrees with the vertical line of the horizontal plane. More preferably, the rotation central axes of the first through holes 410-1 and 410-2 may be at an angle of 11 degrees~12 degrees with the vertical line of the horizontal plane. A distance between the centers of the two through holes may be 70 mm~150 mm.

Preferably, the distance between the centers of the two through holes may be 80 mm~140 mm. More preferably, the distance between the centers of the two through holes may be 90 mm~130 mm. More preferably, the distance between the centers of the two through holes may be 100 mm~120 mm. More preferably, the distance between the centers of the two through holes may be 105 mm~115 mm. More preferably, the distance between the centers of the two through holes may be 107 mm~113 mm. More preferably, the distance between the centers of the two through holes may be 109 mm~111 mm.

In some embodiments, the first through holes 410-1 and 410-2 may be provided with an observation unit 217. Since a crystal growth period is relatively long (e.g., 10 days 40 days), a unit through which the internal situation of the temperature field device 200 can be observed may be mounted on the temperature field device 200. A user (e.g., a worker in a factory) can observe the growth of the crystal through the observation unit 217. If an abnormal situation is found, a timely remedial action can be executed.

Figure 5:
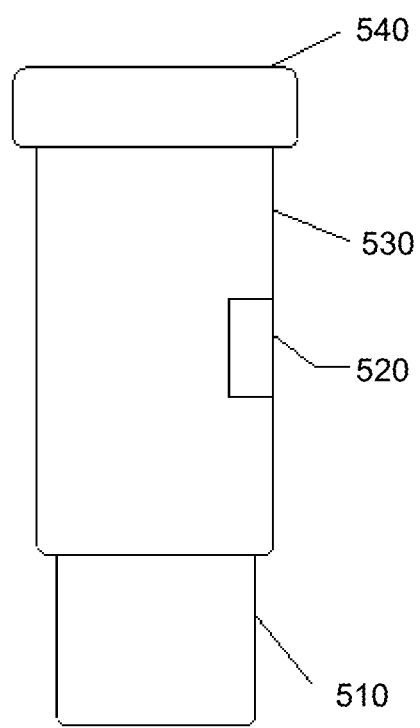
FIG. 5 is a schematic diagram illustrating an exemplary observation unit according to some embodiments of the present disclosure.

FIG. 5 is a schematic diagram illustrating an exemplary observation unit according to some embodiments of the present disclosure. The observation unit 217 may include a tubular unit with a closed end and an open end. The observation unit 218 may include a first part 510. A size of the first part 510 may be matched with the first through hole 410-1/410-2 of the first cover plate 211, thereby realizing a connection between the observation unit 217 and the first cover plate 211, for example, via a riveting connection, a screw connection, etc. Meanwhile, a lower end of the first port 510 may be open, accordingly, after the observation unit 217 is connected with the first cover plate 211, a connection between an inner chamber of the observation unit 217 and the first through hole 410-1/410-2 can be achieved. According to the diameter of the first through hole 410-1/410-2, a diameter of the first part 510 may be 15 mm~30 mm. Preferably, the diameter of the first part 510 may be 18 mm~27 mm. More preferably, the diameter of the first part 510 may be 20 mm~25 mm. More preferably, the diameter of the first part 510 may be 21 mm~24 mm. More preferably, the diameter of the first part 510 may be 22 mm~23 mm. The observation unit 217 may further include a second through hole 520. The second through hole 520 may be mounted at any position of a second part 530 of the observation unit 217, and communicate with the internal chamber of the observation unit 217. After that the observation unit 217 is connected to the first through hole 410-1/410-2, the second through hole 520 may be used to get gas passing through. In some embodiments, a diameter of the second through hole 520 may be 3 mm~10 mm. Preferably, the diameter of the second through hole 520 may be 4 mm~9 mm. More preferably, the diameter of the second through hole 520 may be 5 mm~8 mm. More preferably, the diameter of the second through hole 520 may be 6 mm~7 mm. The second part 530 may include a part of the observation unit 217 that is protruded outside the first cover plate 211 after that the observation unit 217 is connected to the first through hole 410-1/410-2, and its height may be 50 mm~100 mm. Preferably, the height of the second part 530 may be 60 mm~90 mm. More preferably, the height of the second part 530 may be 70 mm~80 mm. More preferably, the height of the second part 530 may be 71 mm~79 mm. More preferably, the height of the second part 530 may be 72 mm 78 mm. More preferably, the height of the second part 530 may be 73 mm~77 mm. More preferably, the height of the second part 530 may be 74 mm~76 mm. In some embodiments, a diameter of the second part 530 may be 200 mm~500 mm. Preferably, the diameter of the second part 530 may be 250 mm~450 mm. More preferably, the diameter of the second part 530 may be 300 mm~400 mm. More preferably, the diameter of the second part 530 may be 310 mm~390 mm. More preferably, the diameter of the second part 530 may be 320 mm~380 mm. More preferably, the diameter of the second part 530 may be 42 mm~48 mm. More preferably, the diameter of the second part 530 may be 430 mm~370 mm. More preferably, the diameter of the second part 530 may be 440 mm~360 mm. More preferably, the diameter of the second part 530 may be 345 mm~355 mm. The observation unit 217 may also include an observation window 540. The observation window 540 may be mounted on a top of the observation unit 217, and may be made of a transparent material, such as quartz, polymethyl methacrylate (PMMA), polystyrene (PS), polycarbonate (PC), or the like, or any combination thereof. The user (e.g., the worker in the factory) may observe an internal situation of the temperature field device 200 through the observation window 540. In some embodiments, an outer diameter of the observation window 540 may be 40 mm~50 mm. Preferably, the outer diameter of the observation window 540 may be 42 mm~48 mm. More preferably, the outer diameter of the observation window 540 may be 44 mm~47 mm. In some embodiments, an inner diameter of the observation window 540 may be 20 mm~25 mm. More preferably, the inner diameter of the observation window 540 may be 22 mm~24 mm. In some embodiments, a height of the observation window 540 may be 50 mm~100 mm. Preferably, the height of the observation window 540 may be 55 mm~95 mm. More preferably, the height of the observation window 540 may be 55 mm~95 mm. More preferably, the height of the observation window 540 may be 65 mm~85 mm. More preferably, the height of the observation window 540 may be 70 mm~80 mm. More preferably, the height of the observation window 540 may be 72 mm~78 mm. More preferably, the height of the observation window 540 may be 74 mm~76 mm.

Similarly, in order to reduce heat radiation emitted above the temperature field device 200, the first cover plate 211 may be provided with channel(s) for a circulation cooling fluid. As shown in FIG. 4, the first cover plate 211 may include a channel 420 for circulation cooling fluid. A cooling liquid may flow through the channel 420. The cooling liquid may include water, ethanol, ethylene glycol, isopropyl alcohol, n-hexane, or the like, or any combination thereof. For example, the cooling liquid may include a 50:50 mixed liquid of water and ethanol. Through cooling liquid inlets 430-1 and/or 430-2, the cooling liquid may flow into the circulating cooling liquid channels 440-1, 440-2, and 440-3, which may be mounted in the first cover plate 211. After absorbing heat dissipated from the temperature field device 200, the cooling liquid may flow out from the cooling liquid outlet 430-3. The cooling liquid may be returned to the cooling liquid channel 420 through other channels, and a next cycle may be performed. In some embodiments, diameters of the circulating cooling liquid channels 440-1, 440-2, and 440-3 may be 5 mm~25 mm. Preferably, the diameters of the circulating cooling liquid channels 440-1, 440-2, and 440-3 may be 10 mm~20 mm. More preferably, the diameters of the circulating cooling liquid channels 440-1, 440-2, and 440-3 may be 11 mm 19 mm. More preferably, the diameters of the circulating cooling liquid channels 440-1, 440-2, and 440-3 may be 12 mm~18 mm. More preferably, the diameters of the circulating cooling liquid channels 440-1, 440-2, and 440-3 may be 13 mm~17 mm. More preferably, the diameters of the circulating cooling liquid channels 440-1, 440-2, and 440-3 may be 14 mm~15 mm.

In some embodiments, the first cover plate 211 may further include a third through hole 450. For example, when the crystal growth is executed based on the Czochralski technique, a channel (e.g., the third through hole 450) for entrance and/or exit of the pulling rod 200 into and/or from the temperature field device 200 may be mounted on the first cover plate 211. The pulling rod may include an iridium pulling rod. The third through hole 450 may be mounted at a center of the first cover plate 211. A size of the third through hole 450 may be determined based on a size of the pulling rod.

The second cover plate 212 may be mounted in the first drum 204, cover the open end of the second drum 206 near the first cover plate 211, and may be connected to the second drum 206 via a welding connection, a riveting connection, a bolting connection, a bonding connection, or the like, or any combination thereof. In some embodiments, the second cover plate 212 may be made of a material with a relatively good heat preservation performance to perform the heat preservation function. The second cover plate 212 may include alumina plate, a zirconia plate, a ceramic plate, a metal plate, etc. In some embodiments, a diameter of the second cover plate 212 may be determined based on the inner diameter of the first drum 204. The second cover plate 212 may fit the inner wall of the first drum 204. The second cover plate 212 may cover one end of the second drum 206, thereby preventing the filler 208 filled in the space between the first drum 204 and the second drum 206 from falling out and polluting the reactants in the crucible 213. In order to observe the internal situation of the temperature field device 200 from outside in existence of the second cover plate 212, through holes (also referred to as fourth through holes) corresponding to the through holes (e.g., the first through hole 410-1/410-2, the third through hole 450) on the first cover plate 211 may be mounted on the second cover plate 212. Rotation central axes of the fourth through holes may be the same as or similar to that of the first and/or the third through holes. That is, the fourth through holes may be mounted on the second cover plate 212 along the rotation central axes of the first and/or third through holes. In some embodiments, diameters of the fourth through holes corresponding to the first through hole 410-1/410-2 may be 8 mm~15 mm. Preferably, the diameters of the fourth through holes corresponding to the first through hole 410-1/410-2 may be 9 mm~14 mm. More preferably, the diameters of the fourth through holes corresponding to the first through hole 410-1/410-2 may be 10 mm~13 mm. More preferably, the diameters of the fourth through holes corresponding to the first through hole 410-1/410-2 may be 11 mm~12 mm. The rotation center axes of the fourth through holes corresponding to the first through hole 410-1/410-2 may be at an angle of 3 degrees~20 degrees with a vertical line of the horizontal plane. Preferably, the rotation center axes of the fourth through holes corresponding to the first through hole 410-1/410-2 may be at an angle of 5 degrees~18 degrees with the vertical line of the horizontal plane. More preferably, the rotation center axes of the fourth through holes corresponding to the first through hole 410-1/410-2 may be at an angle of 7 degrees~15 degrees with the vertical line of the horizontal plane. More preferably, the rotation center axes of the fourth through holes corresponding to the first through hole 410-1/410-2 may be at an angle of 9 degrees~13 degrees with the vertical line of the horizontal plane. More preferably, the rotation center axes of the fourth through holes corresponding to the first through hole 410-1/410-2 may be at an angle of 11 degrees~12 degrees with the vertical line of the horizontal plane. A distance between the centers of the fourth through holes corresponding to the first through holes 410-1/410-2 may be 60 mm~120 mm. Preferably, the distance between the centers of the fourth through holes corresponding to the first through holes 410-1/410-2 may be 70 mm~100 mm. More preferably, the distance between the centers of the fourth through holes corresponding to the first through holes 410-1/410-2 may be 80 mm~110 mm. More preferably, the distance between the centers of the fourth through holes corresponding to the first through holes 410-1/410-2 may be 85 mm~95 mm. More preferably, the distance between the centers of the fourth through holes corresponding to the first through holes 410-1/410-2 may be 87 mm~93 mm. More preferably, the distance between the centers of the fourth through holes corresponding to the first through holes 410-1/410-2 may be 89 mm~91 mm. In some embodiments, a diameter of a fourth through hole corresponding to the third through hole may be 15 mm~50 mm. Preferably, the diameter of the fourth through hole corresponding to the third through hole may be 20 mm~45 mm. More preferably, the diameter of the fourth through hole corresponding to the third through hole may be 25 mm~40 mm. More preferably, the diameter of the fourth through hole corresponding to the third through hole may be 30 mm~35 mm. More preferably, the diameter of the fourth through hole corresponding to the third through hole may be 31 mm~34 mm. More preferably, the diameter of the fourth through hole corresponding to the third through hole may be 32 mm~33 mm. The diameter of the fourth through hole corresponding to the third through hole may affect the amount of heat dissipated from it, thereby affecting the temperature gradient of the temperature field device 200. In this case, the temperature gradient of the temperature field device 200 may be adjusted by changing the diameter of the fourth through hole corresponding to the third through hole.

In some embodiments, a thickness of the second cover plate 212 may be 20 mm~35 mm. Preferably, the thickness of the second cover plate 212 may be 25 mm~30 mm. More preferably, the thickness of the second cover plate 212 may be 26 mm~29 mm. More preferably, the thickness of the second cover plate 212 may be 27 mm~28 mm. In some embodiments, a position of the second cover plate 212 in the temperature field device 200 may be determined based on the length and/or the position of the second drum 206. When the length of the second drum 206 is greater than a length threshold, the second cover plate 212 may be close to the first cover plate 211. A certain distance may be maintained between the second cover plate 212 and the first cover plate 211.

Figure 6:
FIG. 6 is a schematic diagram illustrating a longitudinal sectional view of an exemplary first heater according to some embodiments of the present disclosure.
Figure 7:
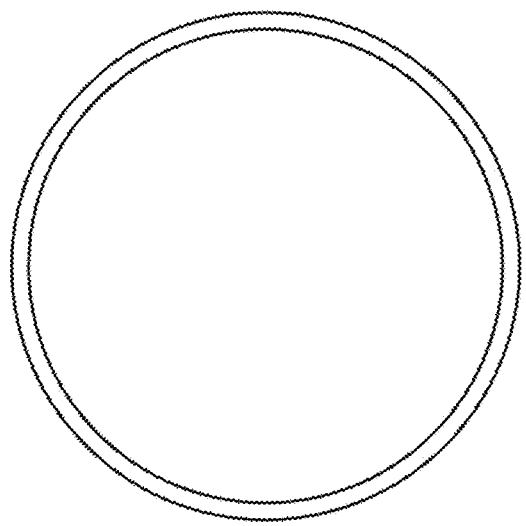
FIG. 7 is a schematic diagram illustrating a top view of an exemplary first heater according to some embodiments of the present disclosure.
Figure 8:
FIG. 8 is a schematic diagram illustrating a longitudinal sectional view of an exemplary second heater according to some embodiments of the present disclosure.
Figure 9:
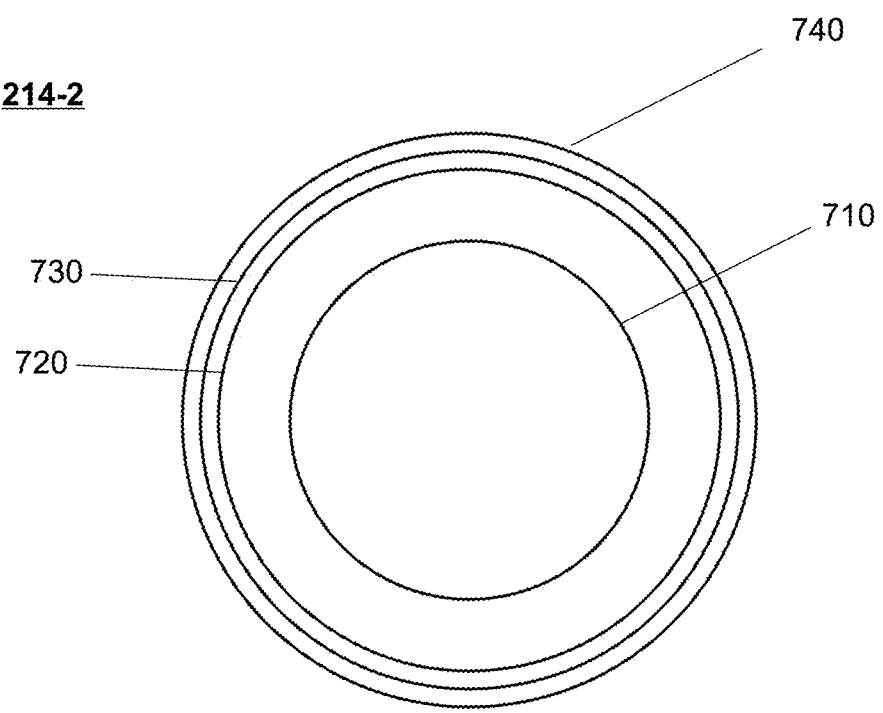
FIG. 9 is a schematic diagram illustrating a top view of an exemplary second heater according to some embodiments of the present disclosure.

FIGS. 6-9 are schematic diagrams illustrating an exemplary heater according to some embodiments of the present disclosure. FIG. 6 is a schematic diagram illustrating a longitudinal sectional view of a first heater 214-1, FIG. 7 is a schematic diagram illustrating a top view of the first heater 214-1, FIG. 8 is a schematic diagram illustrating a longitudinal sectional view of a second heater 214-2, and FIG. 9 is a schematic diagram illustrating a top view of the second heater 214-2. The first heater 214-1 and the second heater 214-2 may constitute an annealing region. The second heater 214-2 may be placed above the crucible 213. For example, the second heater 214-2 may be disposed on the crucible 213 via a bolting connection, a welding connection, a hinge connection, a buckle connection, or the like, or any combination thereof. The first heater 214-1 may be disposed above the second heater 214-2. For example, the first heater 214-1 may be disposed on the second heater 214-2 via a bolting connection, a welding connection, a hinge connection, a buckle connection, or the like, or any combination thereof.

For example, the heater 214-1 may be snapped onto the second heater 214-2 via a groove 750 which may be composed of a ring 720 and a ring 730 as shown in FIG. 8 and FIG. 9. As shown in FIG. 6 and FIG. 7, a shape of the first heater 214-1 may include a cylinder and a thickness of the first heater 214-1 may be a predetermined thickness (e.g., a portion filled with shade shown in FIG. 6 and/or a difference between an inner ring and an outer ring shown in FIG. 7) to maintain a temperature of the temperature field device. The thickness of the first heater 214-1 may be determined based on an inner diameter and an outer diameter of the first heater 214-1. As shown in FIG. 8 and FIG. 9, a shape of the second heater 214-2 may include a cylinder and a thickness of the second heater 214-2 may be a predetermined thickness (e.g., a portion filled with shade shown in FIG. 8 and/or a difference between an inner ring and an outer ring shown in FIG. 9) to maintain the temperature of the temperature field device. The thickness of the second heater 214-2 may be determined based on an inner diameter and an outer diameter of the second heater 214-2. In some embodiments, the temperature of the temperature field device may be adjusted by adjusting a height of the first heater 214-1, the inner diameter of the first heater 214-1, the outer diameter of the first heater 214-1, a height of the second heater 214-2, the inner diameter of the second heater 214-2, and/or the outer diameter of the second heater 214-2, to meet a temperature gradient for crystal growth and a temperature and/or a temperature gradient for annealing. The inner diameter of the first heater 214-1 and/or the second heater 214-2 may be 60 mm~240 mm. Preferably, the inner diameter of the first heater 214-1 and/or the second heater 214-2 may be 80 mm~220 mm. More preferably, the inner diameter of the first heater 214-1 and/or the second heater 214-2 may be 100 mm~200 mm. More preferably, the inner diameter of the first heater 214-1 and/or the second heater 214-2 may be 120 mm~180 mm. More preferably, the inner diameter of the first heater 214-1 and/or the second heater 214-2 may be 140 mm~160 mm. The height of the first heater 214-1 and/or second heater 214-2 may be 2-200 mm. Preferably, the height of the first heater 214-1 and/or second heater 214-2 may be 10 mm~180 mm. More preferably, the height of the first heater 214-1 and/or second heater 214-2 may be 30 mm~150 mm. More preferably, the height of the first heater 214-1 and/or second heater 214-2 may be 70 mm~100 mm. More preferably, the height of the first heater 214-1 and/or second heater 214-2 may be 80 mm~90 mm. More preferably, the height of the first heater 214-1 and/or second heater 214-2 may be 82 mm~88 mm. More preferably, the height of the first heater 214-1 and/or second heater 214-2 may be 84 mm~86 mm. In some embodiments, the outer diameter of the first heater 214-1 and/or the second heater 214-2 may be 64 mm~260 mm. Preferably, the outer diameter of the first heater 214-1 and/or the second heater 214-2 may be 64 mm~240 mm. More preferably, the outer diameter of the first heater 214-1 and/or the second heater 214-2 may be 70 mm~200 mm. More preferably, the outer diameter of the first heater 214-1 and/or the second heater 214-2 may be 75 mm~190 mm. More preferably, the outer diameter of the first heater 214-1 and/or the second heater 214-2 may be 85 mm~180 mm. More preferably, the outer diameter of the first heater 214-1 and/or the second heater 214-2 may be 90 mm~170 mm. More preferably, the outer diameter of the first heater 214-1 and/or the second heater 214-2 may be 100 mm~150 mm. More preferably, the outer diameter of the first heater 214-1 and/or the second heater 214-2 may be 110 mm~140 mm. More preferably, the outer diameter of the first heater 214-1 and/or the second heater 214-2 may be 120 mm~130 mm. More preferably, the outer diameter of the first heater 214-1 and/or the second heater 214-2 may be 122 mm~127 mm. More preferably, the outer diameter of the first heater 214-1 and/or the second heater 214-2 may be 123 mm~125 mm.

Figure 10:
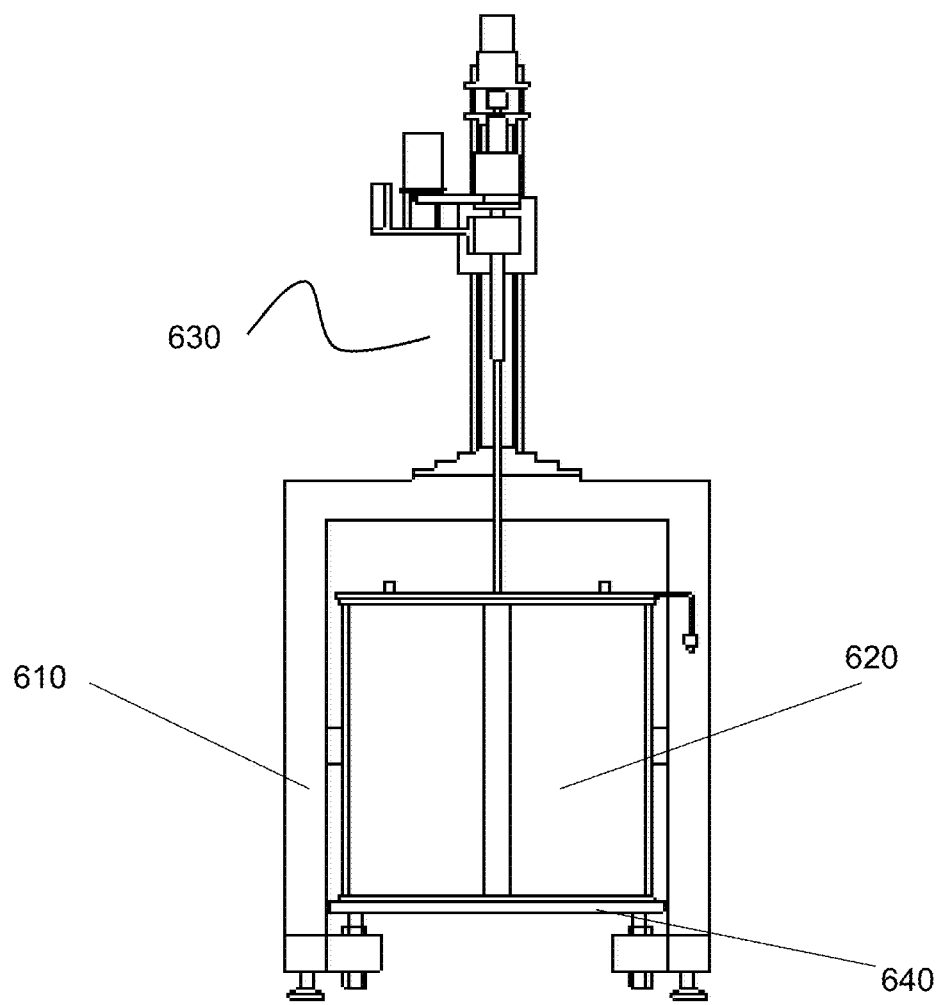
FIG. 10 is a schematic diagram illustrating an exemplary crystal growth device according to some embodiments of the present disclosure.

FIG. 10 is a schematic diagram illustrating an exemplary crystal growth device according to some embodiments of the present disclosure. As shown in FIG. 10, the crystal growth device 400 may include a furnace frame 610, a furnace chamber 620, a motion device 630, and a first bottom plate 640. The furnace frame 610 may be configured to support one or more components of the crystal growth device, for example, the furnace chamber 620, the motion device 630, the first bottom plate 640, or the like, or any combination thereof. Merely by way of example, the furnace chamber 620 may be disposed on the furnace frame 610 via a bolting connection, a welding connection, a hinge connection, or the like, or any combination thereof. The furnace chamber 620 may include one or more parts such as a furnace body, a furnace cover, etc. The furnace cover may be disposed on a top of the furnace body. The furnace cover may be provided with a through hole and a temperature field device (e.g., the temperature field device 200) may be placed above the through hole. In some embodiments, the furnace chamber 620 may be configured to provide a space for crystal growth. A shape of the furnace chamber 620 may include a cube, a cylinder, etc. In some embodiments, the furnace chamber 620 may be designed as a non-closed structure, that is, after the temperature field device is placed on the furnace cover, the furnace cover and an outer wall of the temperature field may not be sealed. In some embodiments, the motion device 630 may include a pulling component, a weighting component, a rotation component, or the like, or any combination thereof. The pulling component may be disposed on the furnace frame 610. The pulling component may be configured to control a movement of a pulling rod. The weighing component may be configured to determine a weight of the crystal on the pulling component. The rotation component may be configured to drive a rotation of the pulling component. The first bottom plate 640 may be configured to support other components such as the furnace 620, the temperature field device, a heat source, or the like, or any combination thereof. In some embodiments, the first bottom plate 640 may be a part of the furnace body 620.

Figure 11A:
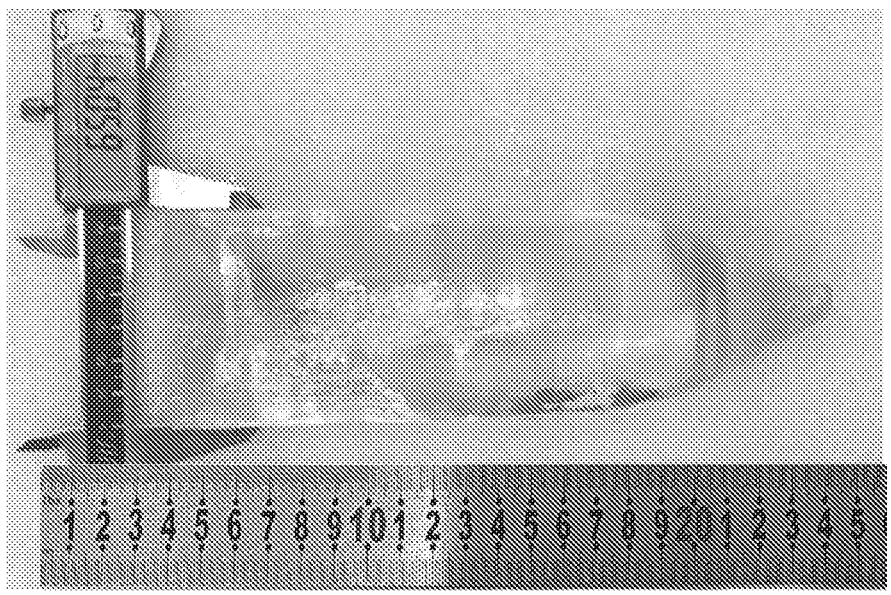
FIG. 11A is a schematic diagram illustrating an exemplary image of a removed crystal according to some embodiments of the present disclosure.
Figure 11B:
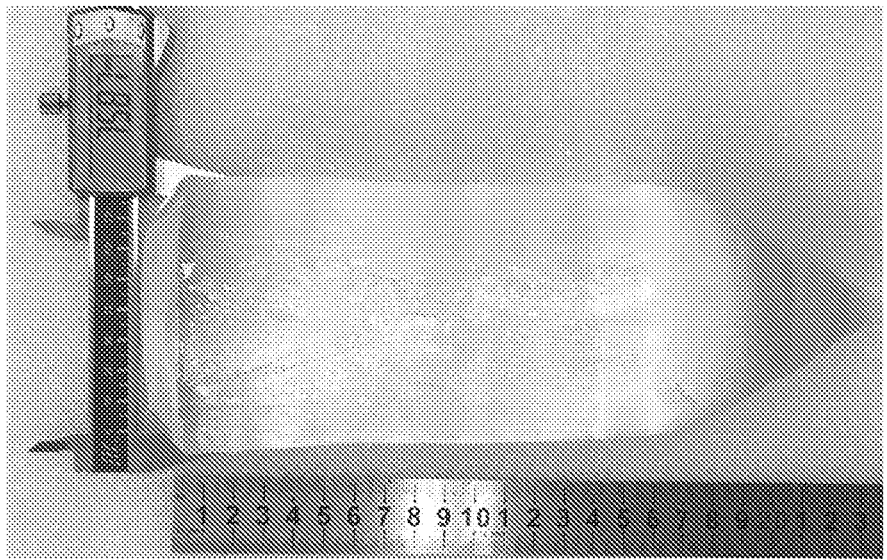
FIG. 11B is a schematic diagram illustrating an exemplary image of a removed crystal according to some embodiments of the present disclosure.

FIGS. 11A and 11B are schematic diagrams illustrating an exemplary image of a removed crystal according to some embodiments of the present disclosure. As shown in FIG. 11A, a diameter of the removed crystal is 65.04 mm. The removed crystal is transparent. The removed crystal has no macro defects such as crack, a wrapping material, etc. The removed crystal has a complete appearance.

According to the devices and the methods for growing crystals, excess reactants (e.g., silicon dioxide) are used and a following gas is introduced, which can reduce or avoid composition deviation caused by volatility of the reactants during the growth process and improve the crystal performance consistency and growth repeatability. Further, one or more elements such as Ce, Li, B, or Gb may be doped into the crystal to realize a function for detecting γ-rays, X-rays, and neutrons.

In addition, by optimizing the parameters of the crystal growth process, the crystal performance consistency is improved. It should be noted that different embodiments may have different beneficial effects. In different embodiments, the possible beneficial effects may have one or more above described beneficial effects, or any other beneficial effect.

EXAMPLES

The present disclosure may be further described according to the following embodiments.

Embodiment 1—the Installation of the Temperature Field Device 200

In step 1, the bottom plate 202 may be mounted on an aluminum plate of a crystal growth device. A level of the bottom plate 202 may be adjusted to 0.02.

In step 2, the second drum 206 may be mounted on the bottom plate 202, and a concentricity and a verticality between the second drum 206 and bottom plate 202 may be adjusted. The concentricity between the second drum 206 and the bottom plate 202 may be less than 0.5 mm and the perpendicularity between the second drum 206 and the bottom plate 202 may be less than 0.2 degrees.

In step 3, the first drum 204 may be mounted on the bottom plate 202, and a concentricity and a verticality between the first drum 204 and bottom plate 202 may be adjusted. The concentricity between the first drum 204 and the bottom plate 202 may be less than 0.5 mm and the perpendicularity of the first drum 204 and the bottom plate 202 may be less than 0.2 degrees. A high-temperature adhesive may be used to seal a joint between the first drum 204 and the bottom plate 202, thereby ensuring a positive pressure and avoiding gas leakage.

In step 4, the filler 208 may be filled in the space between the first drum 204 and the second drum 206, and filled in the bottom of the second drum 206. The amount and the tightness of the filler 208 may be determined according to a growth condition of the crystal.

In step 5, the crucible 213 may be placed on the filler 208 filled in the bottom of the second drum 206. A vertical distance between an upper edge of the crucible 213 and an upper edge of the induction coil 216 may be 0 mm~50 mm. "0" represents that the upper edge of crucible 213 is flush with the upper edge of induction coil 216, "+" represents that the upper edge of the crucible 213 is higher than the upper edge of the induction coil 216. The vertical distance between the upper edge of the crucible 213 and the upper edge of the induction coil 216 may be determined according to the growth condition of the crystal to be grown.

In step 6, the heater 214-1 and the heater 214-2 may be mounted above the crucible 213, and a concentricity among the heater 214-2, the first drum 204, and the second drum 206 may be adjusted.

In step 7, the second cover plate 212 may be mounted above the second drum 206, and a concentricity among the second cover plate 212, the first drum 204, and the second drum 206 may be adjusted.

In step 8, the pressure ring 222 and the sealing ring 220 coated with vacuum grease may be mounted.

In step 9, the first cover plate 211 may be mounted above the first drum 204, and a concentricity between the first cover plate 211 and the first drum 204 may be adjusted to ensure that the first through-hole(s) (e.g., the first through-hole 410-1/410-2) on the first cover plate 211 may have the same axis with the fourth through-hole(s) corresponding to the second cover plate 212. The pressure ring 222 and the first cover plate 211 may be connected via a thread connection and the sealing ring 220 may be pressed to achieve the sealing function, ensure a positive pressure, and avoid gas leakage.

In step 10, the observation unit 217 may be mounted on the first cover plate 211 and a vent pipe may be connected to the gas channel. Then the temperature field device 200 would be installed.

Example of Ce/Gd:LYSO Crystal Growth

The crystal may be prepared using the Czochralski technique via a medium frequency induction heating mode and a single crystal growth induction furnace with an open furnace. A temperature field device may be mounted according to the steps 1-10 described in embodiment 1. Reactants with purity of 99.999% may be taken out after a roasting process is performed on the reactants at 1200° C. for 5 hours and the reactants are naturally cooled to room temperature 35° C. The reactants may be weighted based on a molar ratio of the reactants according to the following reaction equation:

$$(1-x-y-z)Lu_2O_3+yY_2O_3+SiO_2+2xCeO_2+zGd_2O_3 \rightarrow Lu_{2(1-x-y-z)}Y_{2y}Ce_{2x}Gd_{2z}SiO_5+x/2O_2\uparrow \quad (3)$$

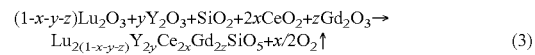

where, x=0.16%, y=10%, z=0.1%, and a weight of $SiO_2$ may excess of 2% of its weight. After being weighted, the reactants may be placed in a three-dimensional mixer for 1 hour 6 hours, and then taken out and placed in a pressing mold and pressed into a cylindrical shape by a cold isostatic pressing device with a pressure of 200 MPa. The reactants may be placed in an iridium crucible with a diameter of 180 mm and a height of 180 mm. The iridium crucible may be placed in the mounted temperature field device. A concentricity between the iridium crucible and the temperature field device may be adjusted and a crucible position of the iridium crucible may be set as ±20 mm. A concentricity among the iridium crucible, the heater 214-1, the heater 214-2, the second cover plate 212, the first cover plate 211, and the weighing guide rod may be successively adjusted. The seal of the first cover plate 211 and the first drum 204 may be ensured. After the observation unit 217 is mounted on the first cover plate 211, a flowing gas of $N_2$ and/or a circulating cooling liquid may be introduced into the temperature field device, and a gas flow rate may be 30 L/min. Parameters of the crystal growth may be set. For example, a diameter of the crystal may be set as 75 mm, a shoulder length may be set as 75 mm, an isometric length may be set as 200 mm, an ending length may be set as 60 mm, a heating time may be set as 24 hours, a rotation rate may be set as 10 rpm, a pulling rate may be set as 1.5 mm/h, a cooling time may be set as 100 hours, a PID value may be set as 0.5, a crystal density may be set as 7.25 g/cm³, and a melt density may be set as 6.15 g/cm³. After the parameters are set, a seed crystal of Ce/Gd:LYSO may be placed on a top of a pulling rod which may be connected to a weighing guide rod and a concentricity between the seed crystal and the first cover plate 211 may be adjusted. The temperature may be increased to melt the reactants. During rising temperature, the seed crystal may be dropped for preheating. To avoid cracking of seed crystal, a distance between the seed crystal and a surface of the reactants may be kept as 5 mm~15 mm. After the reactants are melt, the seed crystal may be dropped to contact the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 16 days.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. When being irradiated by a laser, the crystal has no macro defects such as point scattering, a cloud layer, a wrapping material, etc. Through a testing process, the lattice parameters of the crystal are a=1.4254 nm, b=0.6641 nm, c=1.0241 nm, and β=122.2°. A transmittance of the crystal from ultraviolet, visible light, to near-infrared band is greater than 80%. A center wavelength of the crystal is 420 nm, a light yield is greater than or equal to 50000 ph/MeV, an energy resolution may be less than or equal to 9%, and an attenuation time is less than or equal to 45 nanoseconds.

Example of Ce/Gd:LSO Crystal Growth

The crystal may be prepared using the Czochralski technique via a medium frequency induction heating mode and a single crystal growth induction furnace with an open furnace. A temperature field device may be mounted according to the steps 1-10. Reactants with purity of 99.999% may be taken out after a roasting process is performed on the reactants at 1200° C. for 5 hours and the reactants are naturally cooled to room temperature 35° C. The reactants may be weighted based on a molar ratio of the reactants according to the following reaction equation:

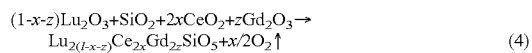

(1-x-z)Lu$_2$O$_3$+SiO$_2$+2xCeO$_2$+zGd$_2$O$_3$→
Lu$_{2(1-x-z)}$Ce$_{2x}$Gd$_{2z}$SiO$_5$+x/2O$_2$↑     (4)

where, x=0.16%, z=0.1%, a weight of SiO$_2$ may excess of 0.2% of its weight. After being weighted, the reactants may be placed in a three-dimensional mixer for 0.5 hours~48 hours, and then taken out and placed in a pressing mold and pressed into a cylindrical shape by a cold isostatic pressing device with a pressure of 100 MPa~300 MPa. The reactants may be placed in an iridium crucible with a diameter of 120 mm and a height of 120 mm. The iridium crucible may be placed in the mounted temperature field device. A concentricity among the iridium crucible, the heater 214-1, the heater 214-2, the second cover plate 212, the first cover plate 211, and the weighing guide rod may be successively adjusted. The seal of the first cover plate 211 and the first drum 204 may be ensured. After the observation unit 217 is mounted on the first cover plate 211, a flowing gas of N$_2$ and/or a circulating cooling liquid may be introduced into the temperature field device, and a gas flow rate may be 30 L/min. Parameters of the crystal growth may be set. For example, a diameter of the crystal may be set as 60 mm, a shoulder length may be set as 60 mm, an isometric length may be set as 200 mm, an ending length may be set as 30 mm, a heating time may be set as 24 hours, a rotation rate may be set as 10 rpm, a pulling rate may be set as 1.5 mm/h, a cooling time may be set as 60 hours, a PID value may be set as 0.5, a crystal density may be set as 7.4 g/cm$^3$, and a melt density may be set as 6.3 g/cm$^3$. After the parameters are set, a seed crystal of Ce/Gd:LSO may be placed on a top of a pulling rod which may be connected to a weighing guide rod and a concentricity between the seed crystal and the first cover plate 211 may be adjusted. The temperature may be increased to melt the reactants. During rising temperature, the seed crystal may be dropped for preheating. To avoid cracking of seed crystal, a distance between the seed crystal and a surface of the reactants may be kept as 5 mm~15 mm. After the reactants are melt, the seed crystal may be dropped to contact the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 14 days.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. When being irradiated by a laser, the crystal has no macro defects such as point scattering, a cloud layer, a wrapping material, etc. Through a testing process, the lattice parameters of the crystal are a=1.4254 nm, b=0.6641 nm, c=1.0241 nm, and β=122°12″. A transmittance of the crystal from ultraviolet, visible light, to near-infrared band is greater than 80%. A center wavelength of the crystal is 420 nm, a Light yield is greater than or equal to 48000 ph/MeV, an energy resolution may be less than or equal to 9%, and an attenuation time is less than or equal to 45 nanoseconds.

It should be noted that the above description for the basic concepts is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Moreover, certain terminology has been used to describe embodiments of the present disclosure. For example, the terms "one embodiment," "an embodiment," and/or "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A crystal, a formula of the crystal being

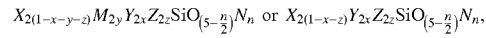

wherein
x=0.0001%~6%, y=0%~100%, z=0.0001~6%,
a value of n is 0~5,
X consists of at least one of an element or one or more compounds containing Ce, the element including La, Y, Gd, Pr, Ce, Nd, Pm, Sm, Eu, Tb, Dy, Ho, Er, Tm, Yb, Mn, Mg, Ca, Al, Fe, Sr, or Ba, and the one or more compounds containing Ce including $CeO_2$, $Ce_2O_3$, $Ce(CO_3)_2$, $CeCl_3$, $CeF_3$, CeS, $CeBr_3$, $CeRu_2$, $CeCo_2$, $CeRh_3$, CeN, $CePd_3$, $CeI_3$, $CeF_4$, or $CeCl_4$,
Y consists of at least one of Cl, F, Br, N, P, or S,
Z consists of at least one of Li, B, Gd, or Tb,
M consists of at least one of Sc, Y, Gd, or Lu,
N consists of at least one of Cl, F, Br, or S, and
$SiO_S^{2-}$ includes Cl—, F—, $Br^-$, or $S^-$.

2. The crystal of claim 1, wherein a value of x is 0.1%~0.6%.

3. The crystal of claim 1, wherein a value of y is 5%~30%.

4. The crystal of claim 1, wherein a value of z is 0.1~0.6%.

5. The crystal of claim 1, wherein the crystal thereof is utilized to capture neutrons to emit radiation or collide with the neutrons to cause a nucleus of the crystal to move in an opposite direction.

* * * * *